United States Patent
Chan

(10) Patent No.: US 9,901,210 B2
(45) Date of Patent: *Feb. 27, 2018

(54) EFFICIENT TRANSFER OF MATERIALS IN MANUFACTURING

(75) Inventor: Chew Foo Chan, Johor Bahru (MY)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 1088 days.

This patent is subject to a terminal disclaimer.

(21) Appl. No.: 13/349,601

(22) Filed: Jan. 13, 2012

(65) Prior Publication Data

US 2013/0184849 A1    Jul. 18, 2013

Related U.S. Application Data

(60) Provisional application No. 61/583,174, filed on Jan. 4, 2012.

(51) Int. Cl.
*A47J 37/07* (2006.01)
*G05B 19/418* (2006.01)
*G06Q 10/08* (2012.01)

(52) U.S. Cl.
CPC .... *A47J 37/0713* (2013.01); *G05B 19/41815* (2013.01); *G06Q 10/08* (2013.01);
(Continued)

(58) Field of Classification Search
CPC .................. G06Q 10/08; G06Q 10/06; G05B 2219/31014; G05B 19/41815;
(Continued)

(56) References Cited

U.S. PATENT DOCUMENTS 4,625,158 A   11/1986   Taenzer
4,646,648 A   3/1987    Lindbom
(Continued)

FOREIGN PATENT DOCUMENTS

WO    2011115617 A1    9/2011

OTHER PUBLICATIONS

Mark Lapedus, Intel re-spins fab for 300-mm, 65-nm chips, http://www.eetimes.com/showArticle.jhtml?articleID=17340769, Nov. 1, 2005.

*Primary Examiner* — Robert Fennema
*Assistant Examiner* — Jigneshkumar Patel
(74) *Attorney, Agent, or Firm* — Horizon IP PTE Ltd.

(57) ABSTRACT

Methods for automated handling for forming a device and automated handling systems for forming a device are presented. One of the methods includes providing a production area with a plurality of destinations and a transport system which includes transport and load/unload (U/L) units in the production area. The transport units include automated guided vehicles (AGVs) with a storage compartment for holding at least one carrier containing production material for forming the device and U/L units include AGVs with a robotic system for handling carriers. A transfer of a selected carrier from a first destination to a second destination is determined. A request to the transport system is issued to effect the transfer of the selected carrier, which includes using a selected U/L unit, a selected transport unit, or a combination of selected U/L and transport units.

19 Claims, 17 Drawing Sheets

(52) U.S. Cl.
CPC ..... *G05B 2219/31014* (2013.01); *Y02P 90/08* (2015.11); *Y02P 90/28* (2015.11); *Y02P 90/285* (2015.11); *Y02P 90/60* (2015.11)

(58) Field of Classification Search
CPC ....... A47J 37/0713; Y02P 90/08; Y02P 90/28; Y02P 90/285
USPC ................................. 700/113, 112; 901/15
See application file for complete search history.

(56) References Cited

U.S. PATENT DOCUMENTS

| | | | |
|---|---|---|---|
| 4,698,775 A | 10/1987 | Koch et al. | |
| 4,702,668 A | 10/1987 | Carlisle et al. | |
| 4,746,843 A | 5/1988 | Taenzer | |
| 4,794,286 A | 12/1988 | Taenzer | |
| 4,795,306 A | 1/1989 | Allan et al. | |
| 4,835,730 A | 5/1989 | Shimano et al. | |
| 4,876,728 A | 10/1989 | Roth | |
| 5,314,293 A | 5/1994 | Carlisle et al. | |
| 5,687,831 A | 11/1997 | Carlisle | |
| 5,810,537 A | 9/1998 | Briner et al. | |
| 6,019,563 A | 2/2000 | Murata et al. | |
| 6,056,108 A | 5/2000 | Buchi et al. | |
| 6,193,199 B1 | 2/2001 | Karam, II | |
| 6,346,809 B1 | 2/2002 | Karam, II | |
| 6,530,734 B2 | 3/2003 | Nering | |
| 6,622,057 B1 | 9/2003 | Ko et al. | |
| 6,895,301 B2* | 5/2005 | Mountz ........................ 700/215 | |
| 6,917,893 B2 | 7/2005 | Dietsch et al. | |
| 6,985,780 B2 | 1/2006 | Hudson et al. | |
| 6,988,008 B2 | 1/2006 | Hudson et al. | |
| 7,174,224 B2 | 2/2007 | Hudson et al. | |
| 7,313,464 B1 | 12/2007 | Perreault et al. | |
| 7,650,013 B2 | 1/2010 | Dietsch et al. | |
| 7,693,654 B1 | 4/2010 | Dietsch et al. | |
| 7,912,633 B1 | 3/2011 | Dietsch et al. | |
| 7,980,808 B2 | 7/2011 | Chilson et al. | |
| 2001/0034557 A1 | 10/2001 | Hudson et al. | |
| 2002/0007229 A1 | 1/2002 | Hudson et al. | |
| 2002/0128810 A1 | 9/2002 | Craig et al. | |
| 2003/0012626 A1 | 1/2003 | Aggarwal | |
| 2003/0180134 A1 | 9/2003 | Lering | |
| 2004/0091338 A1 | 5/2004 | Kim | |
| 2004/0111339 A1 | 6/2004 | Wehrung et al. | |
| 2004/0122570 A1 | 6/2004 | Sonoyama et al. | |
| 2005/0071031 A1 | 3/2005 | Lin et al. | |
| 2005/0080524 A1 | 4/2005 | Park | |
| 2006/0104712 A1* | 5/2006 | Bufano ............ H01L 21/67715 | |
| | | | 404/1 |
| 2007/0027575 A1 | 2/2007 | Chae et al. | |
| 2007/0244594 A1 | 10/2007 | Chik et al. | |
| 2007/0274813 A1 | 11/2007 | Rice et al. | |
| 2008/0071411 A1* | 3/2008 | Anderson ............. G06Q 10/06 | |
| | | | 700/115 |
| 2008/0167817 A1 | 7/2008 | Hessler et al. | |
| 2010/0135760 A1 | 6/2010 | Hjornet | |
| 2011/0015773 A1 | 1/2011 | Wilby | |
| 2011/0112758 A1 | 5/2011 | D'Andrea et al. | |
| 2011/0208745 A1 | 8/2011 | Dietsch et al. | |
| 2012/0316722 A1* | 12/2012 | Zeitler ................. G05D 1/0261 | |
| | | | 701/23 |
| 2013/0004289 A1* | 1/2013 | Gaudette ............. B65G 47/904 | |
| | | | 414/807 |

* cited by examiner

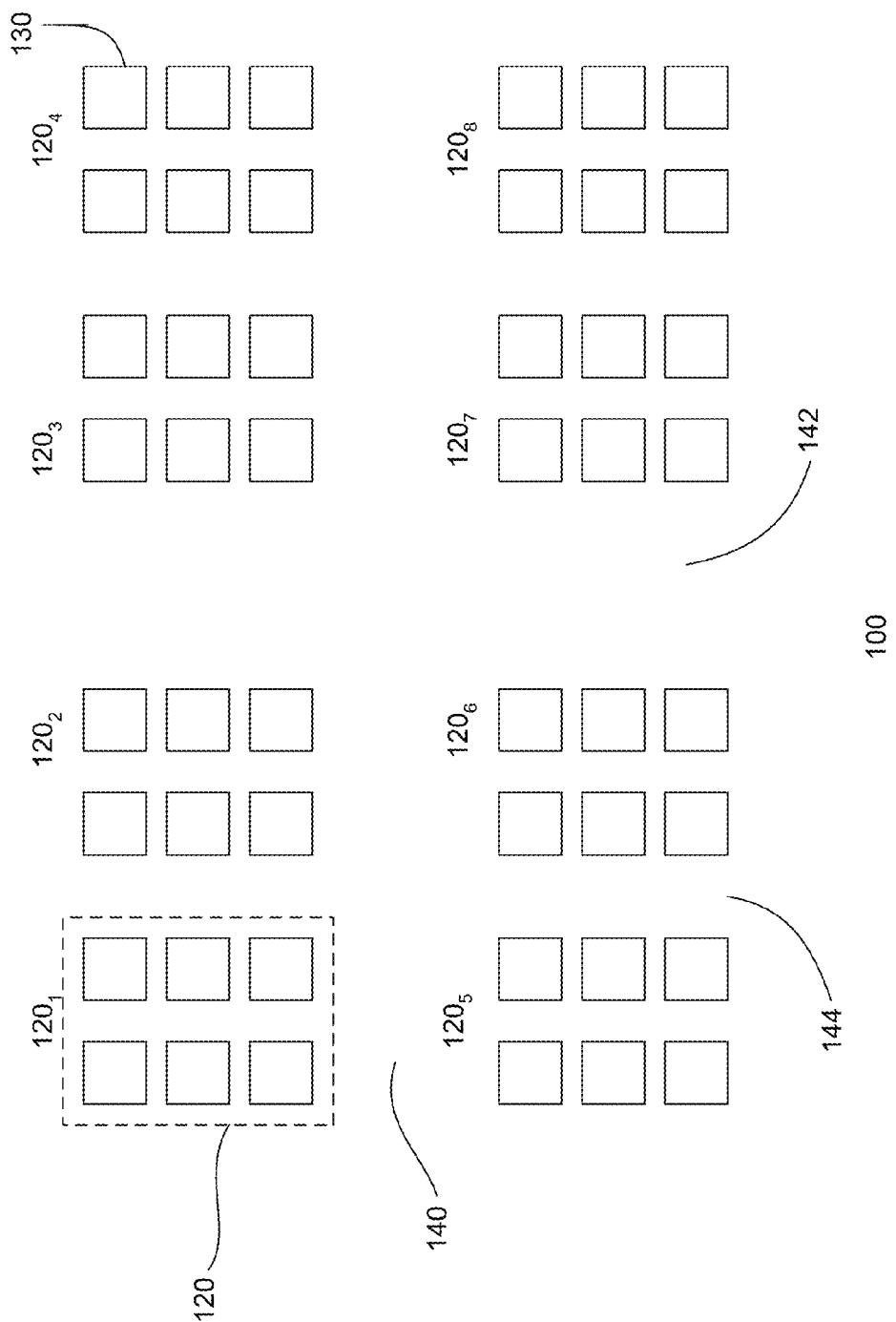

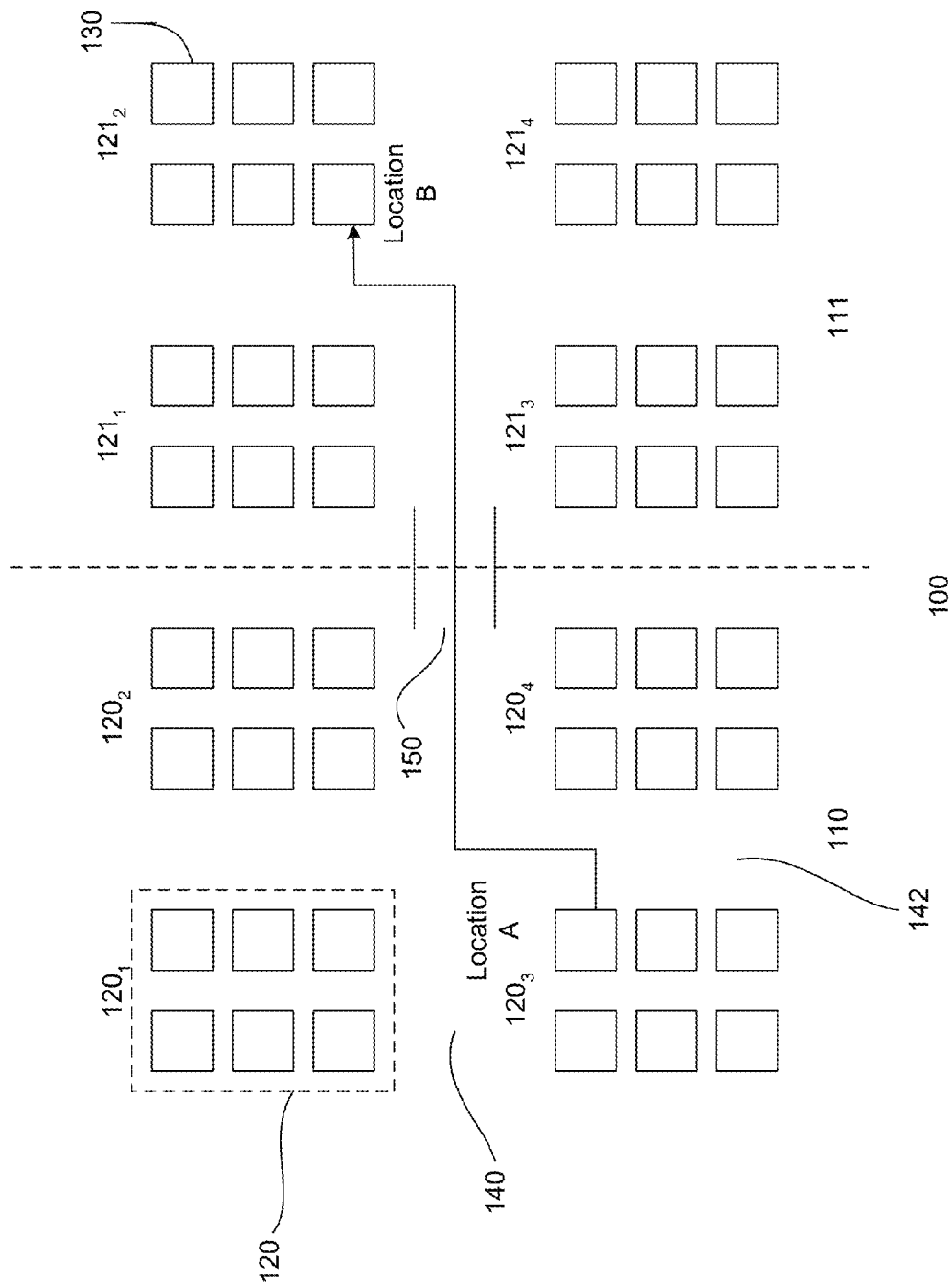

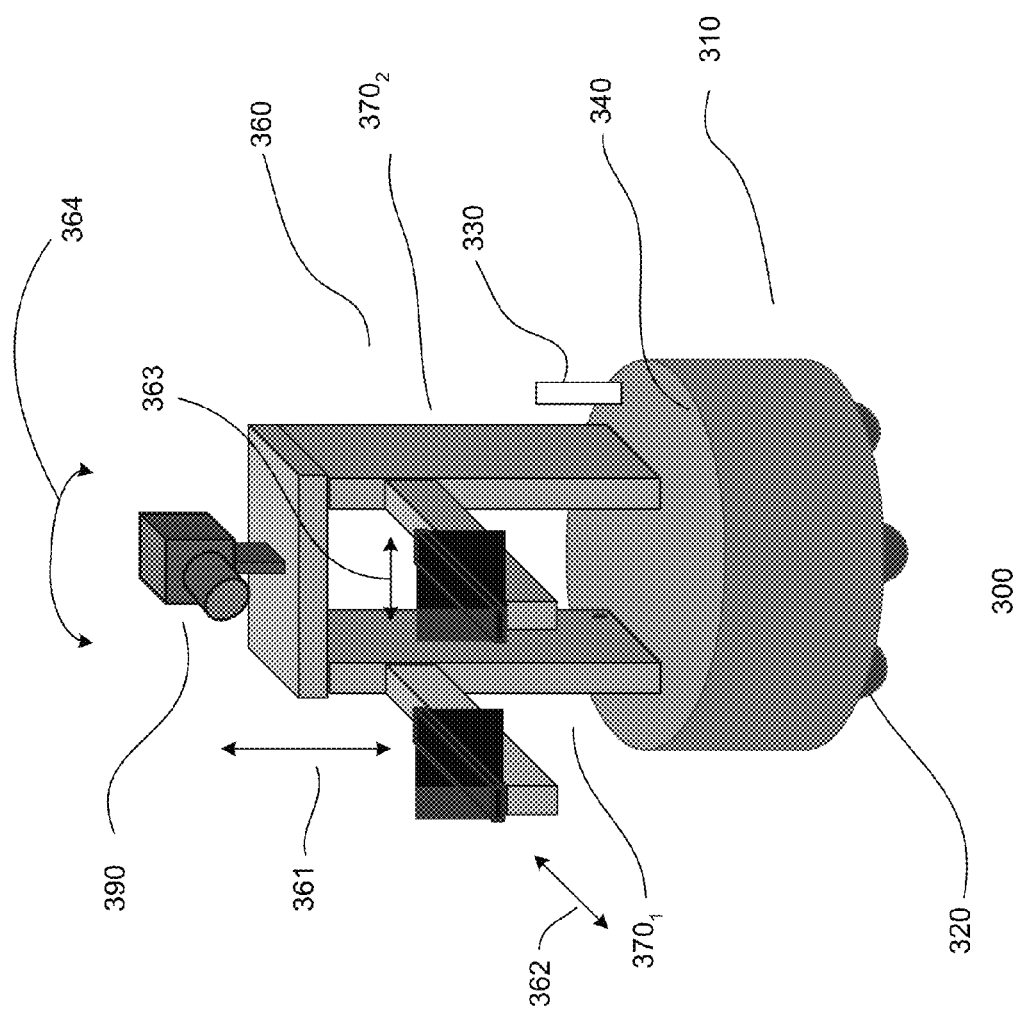

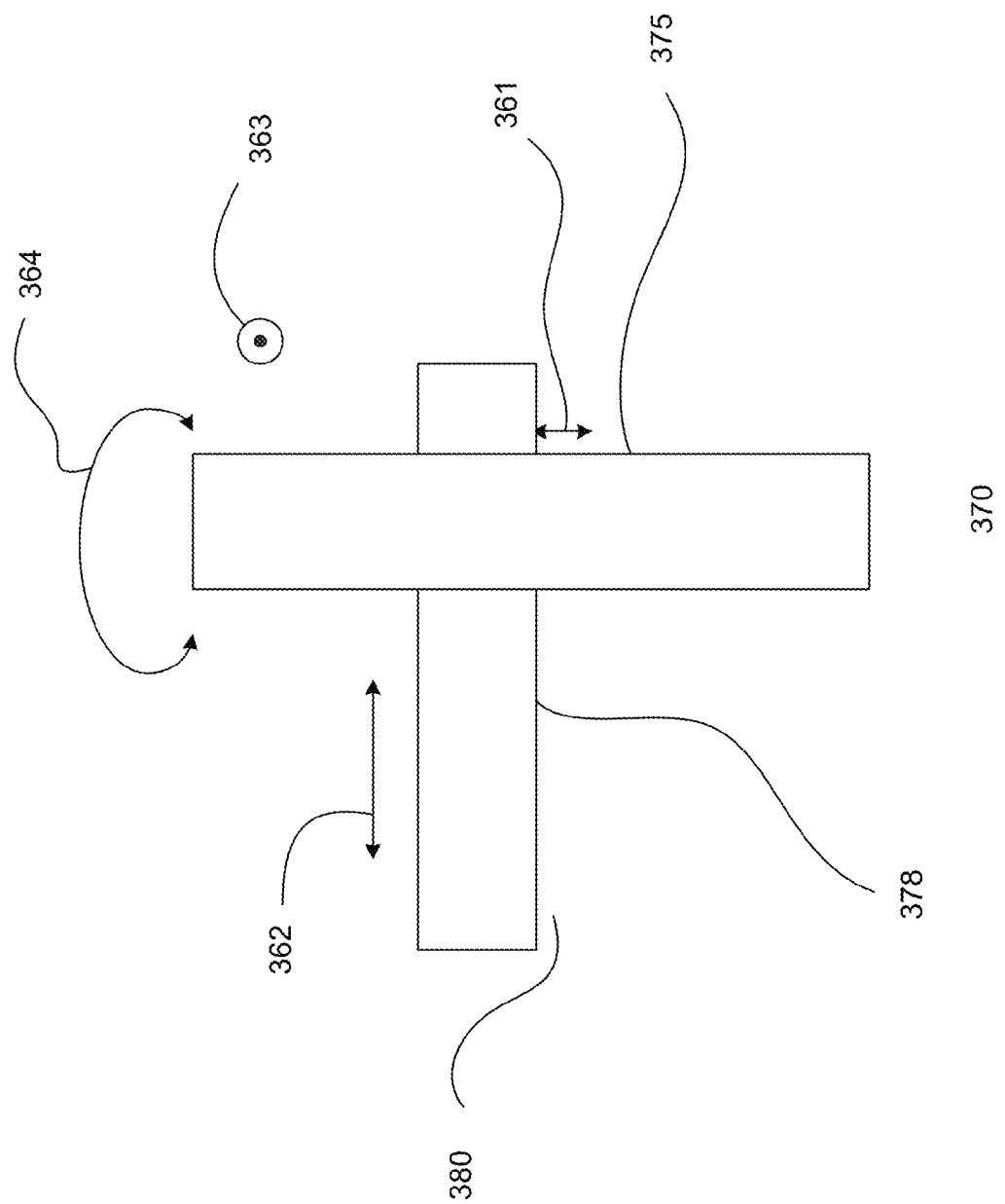

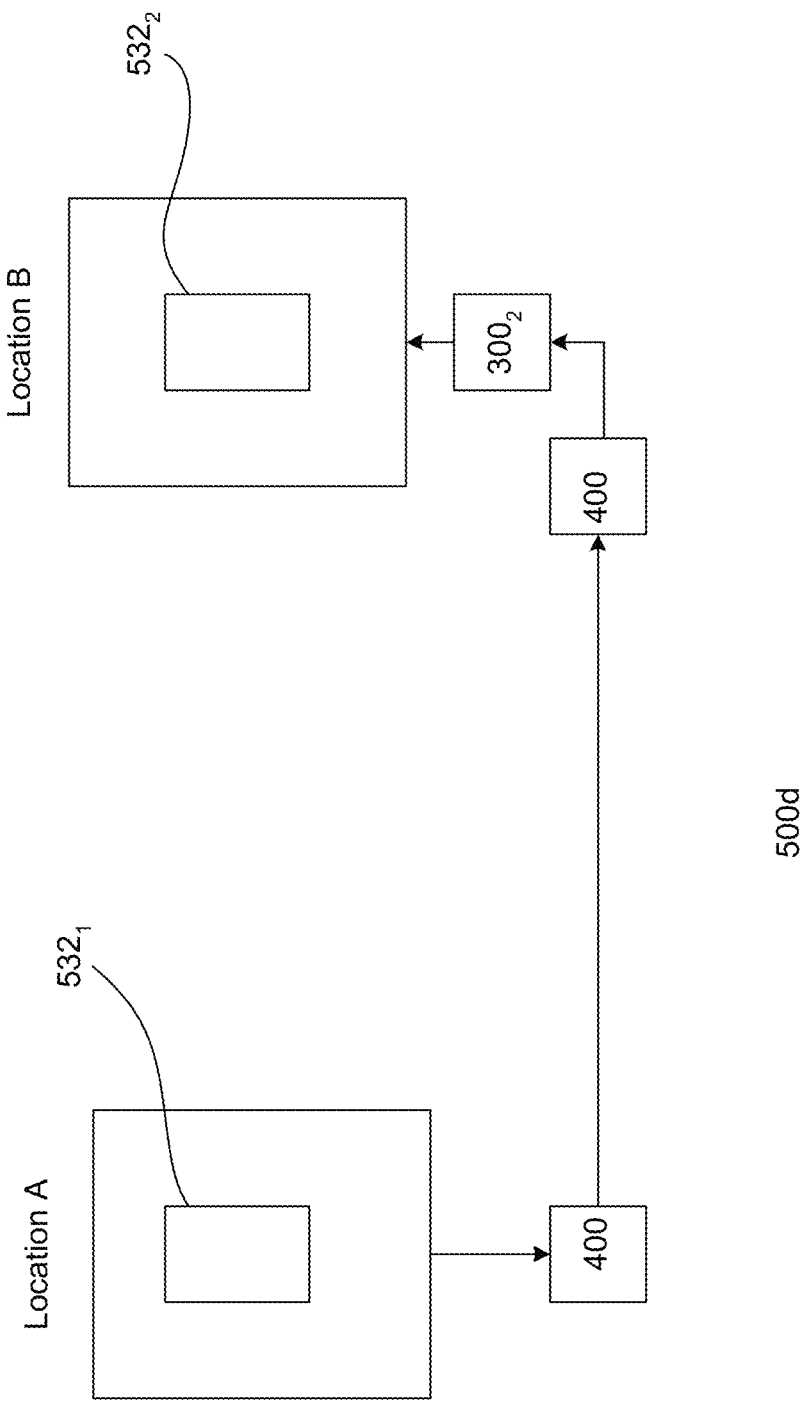

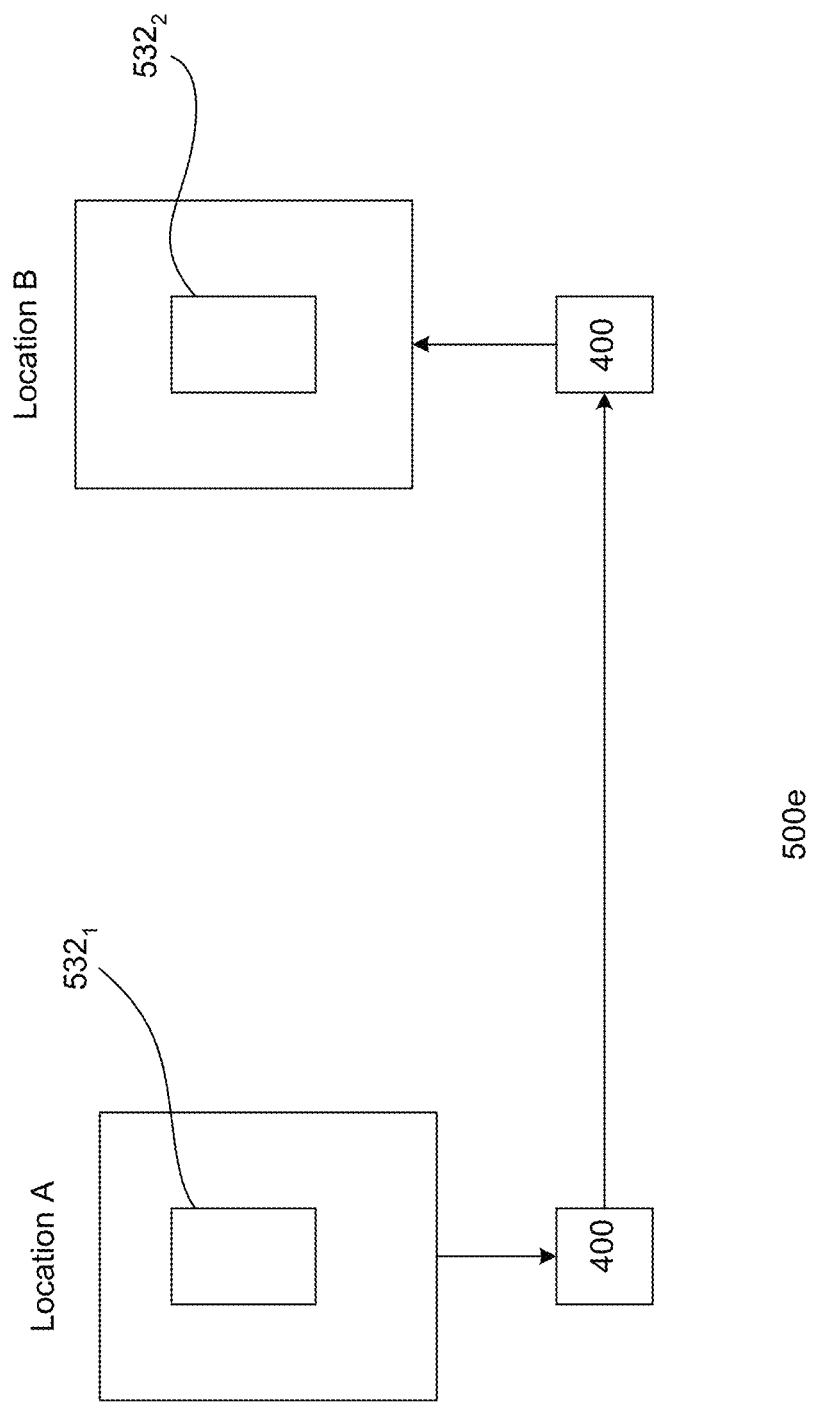

EFFICIENT TRANSFER OF MATERIALS IN MANUFACTURING

BACKGROUND

Manufacturing automation has continued to become increasingly important as the need to improve factory efficiency and maintain high throughput production lines increases. In the manufacturing of semiconductor products, many processes and tools are needed in order to produce completed products for the market. For example, manufacturing of semiconductor products may include over 400 processing steps involving more than 100 different tools. Furthermore, the process route can include a high level of reentrance in which the same tool or tool types are used. An important aspect in manufacturing automation is material handling. To facilitate material handling, a transport system is often employed to support the production line.

Conventional transport systems used in, for example, semiconductor manufacturing include transport vehicles, such as overhead transport (OHT) for transferring wafers contained in a carrier. The use of such systems, however, requires human interaction. For example, human operators are required to load and unload carriers onto and from the transport vehicles. The presence of human operators increases risk of contamination, risk of human error and labor cost. These factors undesirably drive up manufacturing costs.

It is desirable to improve material handling to lower manufacturing costs and increase manufacturing efficiency.

SUMMARY

Embodiments generally relate to methods for automated handling for forming a device and automated handling systems for forming a device. In one embodiment, a method for automated handling for forming a device is disclosed. The method includes providing a production area with a plurality of destinations and a transport system which includes transport and load/unload (U/L) units in the production area. The transport units include automated guided vehicles (AGVs) with a storage compartment for holding at least one carrier containing production material for forming the device and U/L units include AGVs with a robotic system for handling carriers. A transfer of a selected carrier from a first destination to a second destination is determined. A request to the transport system is issued to effect the transfer of the selected carrier, which includes using a selected U/L unit, a selected transport unit, or a combination of selected U/L and transport units.

In another embodiment, a method for automated handling for forming a device is presented. The method includes providing a production facility with a plurality of destinations and providing transport and load/unload (U/L) units in the production facility. A carrier containing material for forming the device is transported from a first machine at a first location to a second machine at a second location. The transporting of the carrier includes a first U/L unit unloading the carrier from the first machine loading it onto a first transport unit. The first transport unit moves from the first location to the second location. The transporting of the carrier also includes a second U/L unit unloading the carrier from the first transport unit and loading it in the second machine.

In still another embodiment, an automated handling system for forming a device is disclosed. The system includes AGV transport units, AGV U/L units and a production control system. The production control system issues commands to the AGV transport and AGV U/L units to control the flow of production for forming the device.

In yet another embodiment, an automated handling system for forming a device is disclosed. The system includes a production facility having a plurality of locations with machines, a carrier containing material for forming a device, and U/L and transport units for effecting transfer of the carrier from a first location to a second location. The transfer from the first location to the second location includes a first U/L unit at the first location. The first U/L unit unloads the carrier from a first machine at the first location and loads it onto a first transport which proceeds to the second location. The transfer also includes a second U/L unit at the second location. The second U/L unit unloads the carrier from the first transport and loads it into a second machine at the second location.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference numbers generally refer to the same parts throughout the different views. Also, the drawings are not necessarily to scale, emphasis instead generally being placed upon illustrating the principles of the invention. In the following description, embodiments of the invention will now be described, by way of example with reference to the drawings of which FIGS. 1a-d show various embodiments of a layout of a fabrication facility and possible routing of material transfers;

FIGS. 3a-c show various embodiments of a load/unload unit;

FIGS. 5a-e show various types of material transfers;

DESCRIPTION

Figure 1B:
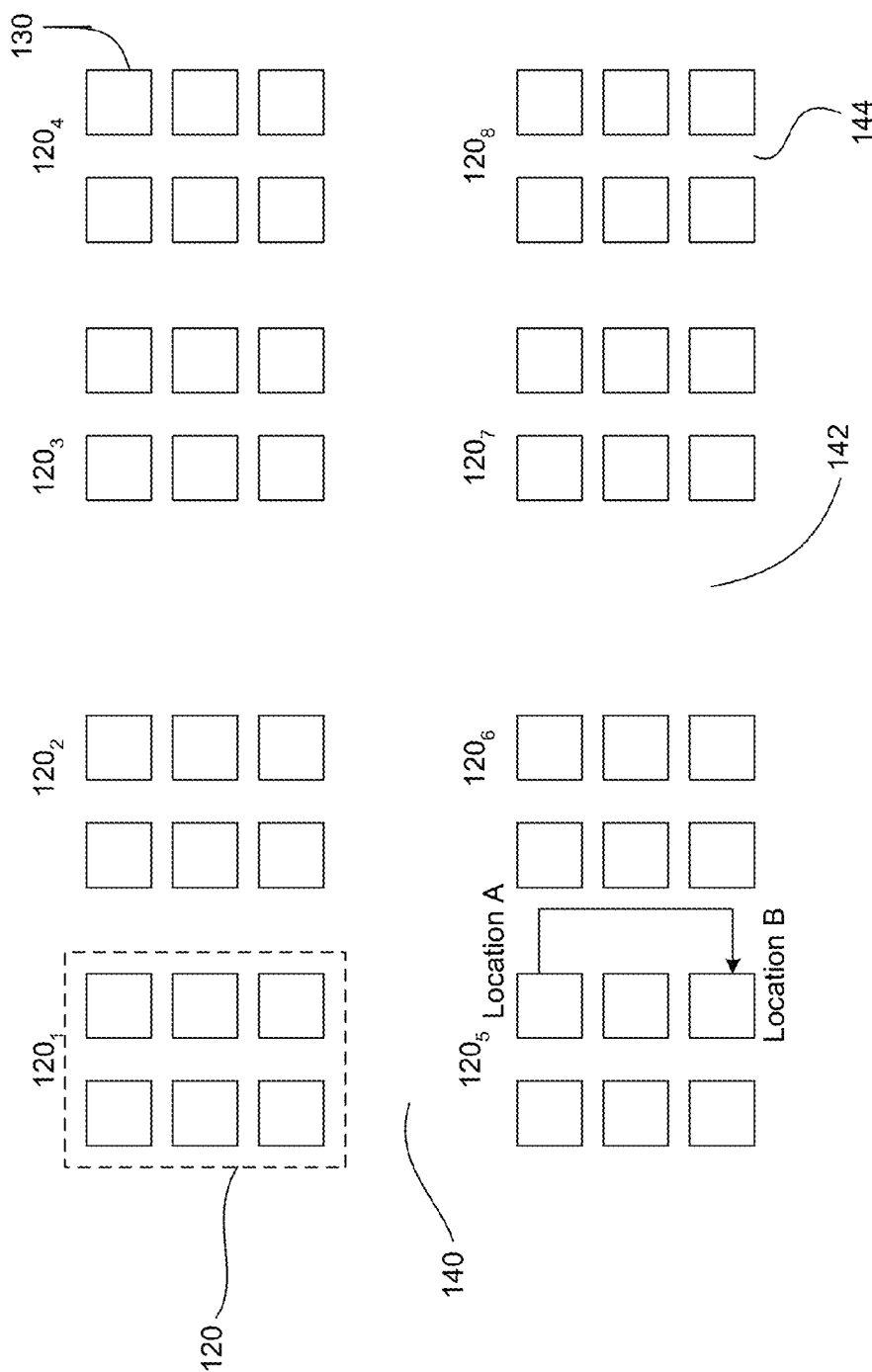

FIG. 1a shows a layout of an exemplary embodiment of a production area 100 of a manufacturing facility. The manufacturing facility may include other areas to facilitate the manufacturing of articles. Such areas, for example, may include research & development (R&D), administration and management, storage, and shipping areas. Additional or other areas may also be provided.

In one embodiment, the production area is a clean room for manufacturing semiconductor devices. The production area may also be used to manufacture other types of devices as found in a semiconductor foundry. The clean room may be a class 100 clean room. Providing clean rooms having other levels of cleanliness may also be useful. The class of clean room, for example, may depend on the technology.

The production area, for example, may be used to produce different types of devices for different customers and different industries. Producing other types of devices, such as flat panel displays (FPDs), which includes liquid crystal displays (LCDs), is contemplated herein.

In semiconductor manufacturing, a carrier is used to contain a batch (lot) of wafers for moving from one location to another in the manufacturing facility. The carrier, for example, may be referred to as a pod. Various types of carriers may be employed. For example, the carrier may be a front opening unified pod (FOUP). Other types of carriers, such as a standard mechanical interface (SMIF) pod, may also be employed. A carrier, for example, has the capacity of 25 wafers. Providing carriers capable of containing other number of wafers may also be useful. For example, a carrier may have a capacity of 13 wafers. A wafer lot may contain any number of wafers up to the capacity of the pod. For example, a wafer batch may contain 1-25 or 1-13 wafers. It is understood that the production facility may utilize different types of carriers, including FOUPs and SMIFs as well as different capacities, such as 13 and 25.

In one embodiment, each wafer is associated with a wafer identification (wafer ID) and each carrier is associated with a carrier or lot ID. A carrier is provided with a carrier tag which contains the carrier ID as well as wafer IDs of wafers contained therein. The carrier tag, for example, also includes information related to the wafers. Such information may include process recipes, customer, priority, delivery date, and other information which enables the wafer to be traced back to the supplier. Providing wafer IDs and carrier IDs enables tracking of each wafer in the manufacturing process. The tag, for example, may be a smart tag having a memory for storing information. Information may be written to or read from by, for example, an infrared reader/writer. Other types of tags, such as radio frequency identification (RFID) tags may also be useful.

Tools 130 are disposed in the production area for use in the production of devices. In one embodiment, the tools are used to process wafers to form semiconductor devices. The tools, for example, may include lithographic tools, deposition tools, such as chemical vapor deposition (CVD) tools, ion implanters, and patterning tools, such as reactive ion etch (RIE) tools. The production area may also include other types of tools, such as those used in failure analysis, testing as well as other functions or purposes. For other industries and in the production of other devices, other types of tools may be provided or included in the facility as are customarily associated with such industries or other devices.

Tools of the production facility, in one embodiment, include machine supervisory programs (MSP) for controlling the operation of the tools. The MSP is a computer program which is provided with and controls the operation of each tool. In one embodiment, tool indexers are provided for the tools. In one embodiment, each tool is associated with an indexer. An indexer is configured to read the carrier tag. In one embodiment, the indexer retrieves information contained in the carrier tag and passes it to the MSP of the tool to which it is associated. The indexer, for example, serves as an interface between the MSP and carrier tag.

An interface may be provided to enable an operator to communicate with the MSP. The interface, for example, may be a computer integrated manufacturing (CIM) interface. Other types of interfaces may also be useful.

In one embodiment, the tools are arranged in groups or bays 120. The tools within a bay may be arranged in a loop configuration. A bay may include different types of tools. In some cases, a bay may include sub-groups of tools. In yet other cases, a bay may include different individual tools as well as one or more sub-group of tools. Other configurations of tools for a bay may also be useful. Although the bays are shown with the same number of tools, it is understood that different bays may have different number and configurations of tools.

For purposes of illustration, the bays are arranged in columns and rows. For example, eight bays $120_{1-8}$ are arranged in two symmetrical rows of four columns each. Main isles 140 and 142 may be provided in the row and column directions. For example, the row main isle 140 separates the rows of bays while the column main isle 142 separates bays in the column direction. As shown, the column main isle is disposed between the second and third column of bays. The main isles, for example, are used for movement of materials between bays (inter-bay). Secondary isles 144 between bays as well as within bays may be used for movement of materials within a bay (intra-bay). Other arrangements may also be employed for inter-bay and intra-bay movement of materials.

Although illustrative, the production area includes two rows and four columns of symmetrically disposed bays, it is understood that a production area may have numerous rows and columns of bays which may not be necessarily symmetrically disposed in the production area. For example, the bays may have different sizes and footprints in the production area and may not be equally spaced apart. Furthermore, other numbers of main column and row isles may also be useful, depending on the overall layout and number of bays.

The production area may include sub-areas which are on different planes, forming stepped production sub-areas. For example, the production area may include two sub-areas, one disposed or is stepped up relative to the other. It is understood that the production area may have more than two sub-areas. Ramps may be provided between the stepped production areas to facilitate transfer of materials from one sub-area to the other.

In some embodiments, the production area may be separated into a plurality of production areas. For example, the manufacturing facility may include more than one production areas. The production areas are housed in separate buildings or structures (fabs). Illustratively, as shown in FIG. 1*d*, the manufacturing facility includes a first fab 110 with bays $120_{1-4}$ and a second fab 111 with bays $121_{1-4}$. Each fab, for example, is a separate clean room. Fabs are interconnected by connectors 150. The connectors, for example, are outside of the clean room environments of the fabs. Providing connectors which is a clean room environment may also be useful.

In one embodiment, stockers may be provided in the production area. The stockers may be disposed throughout the production area to provide temporary storage for carriers. In some embodiments, the stockers may be provisioned by overhead transport (OHT) units of an OHT system. In other embodiments, the stockers can include a combination of stockers and OHT units. In yet other embodiments, the stockers may be provisioned by U/L units.

Figure 2:
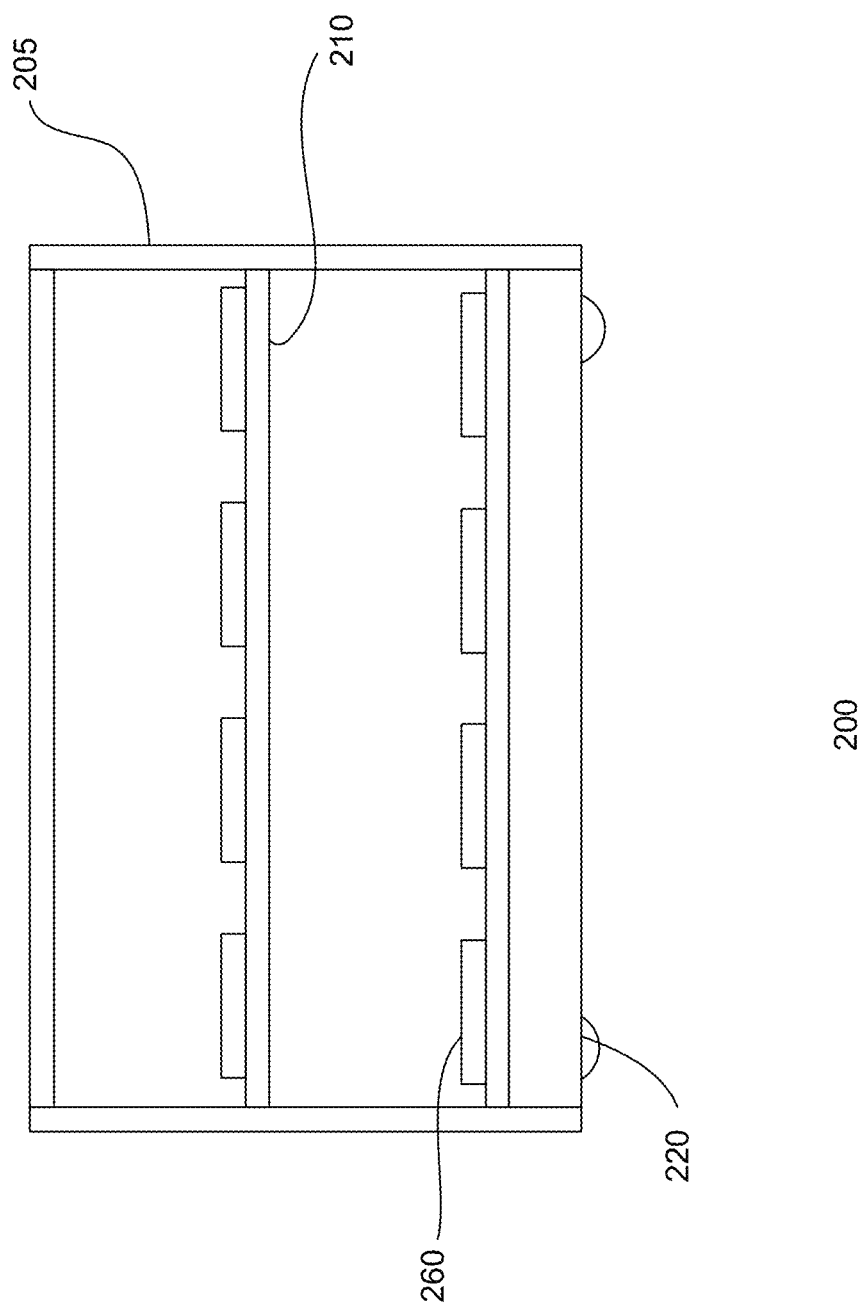
FIG. 2 shows an embodiment of a work-in-progress (WIP) rack.

Additionally, the production area may include work-in-progress (WIP) racks. FIG. 2 shows an embodiment of a WIP rack 200. As shown, the rack includes shelves 210 mounted on a rack frame 205. The rack, for example, includes two shelves. Providing racks with other number of shelves may also be useful. In one embodiment, the rack includes wheels 220 to facilitate moving the rack. In some embodiments, the rack may include a drive system for a mechanized movable rack.

In one embodiment, the shelves are configured with smart trays 260. The smart trays are used to hold carriers. A rack may be used as an alternative to a stocker or other purposes, such as facilitating transfer of carriers from one level of the production area to another. Each smart tray in the rack includes a tray ID. In one embodiment, the smart tray includes a tray tag for containing the tray ID. The tray tag also includes additional information of the carrier which it is holding. The tray tag, for example, is capable of reading or retrieving information contained in the carrier tag of the carrier it is containing. The tray tag, for example, may be accessed by infrared reader/writer. Other types of tray tags, such as radio frequency tags may also be useful.

A rack is associated with a rack ID. The rack ID for example is contained in a rack tag. The rack tag may also include other information. For example, the rack tag may include tray IDs on the rack, carrier IDs and associated information of the carriers on the trays. The rack tag, for example, may be accessed by infrared reader/writer. Other types of rack tags, such as radio frequency tags may also be useful.

The tools, stockers and WIP racks may be collectively referred to as equipment or machines. Additionally, other types of equipment which include an ID tag may be collectively referred to as machines.

A transport system is provided for moving carriers in the production process. The transport system facilitates intra-bay, inter-bay and inter-fab transfers of carriers in the production process.

FIG. 1b shows the transport system performing an intra-bay transfer of a carrier within the same bay. As shown, the transport system transfers a carrier from Location A to Location B, both within bay $120_5$. Location A may be a tool and Location B may be another tool, resulting in a direct tool-to-tool transfer. For example, the transport system transports a processed carrier from the unload port of the tool at Location A to the load port of the tool at Location B. Depending on the tool, it may have separate load and unload ports or a common port for both loading and unloading. Other configurations of ports for tools may also be useful. Alternatively, Location A may be a tool while Location B is another tool in a different group of tools. An indirect tool-to-tool transfer may also be effected. An indirect transfer involves more than one transfer between tools. For example, one location may be a tool (Location A or Location B) while the other location (Location B or Location A) may be a stocker or a rack. An indirect transfer may also involve stockers, racks or a combination thereof at both locations. In some cases, an indirect transfer involves more than two transfers between tools. Other types of transfer may also be useful.

Figure 1C:
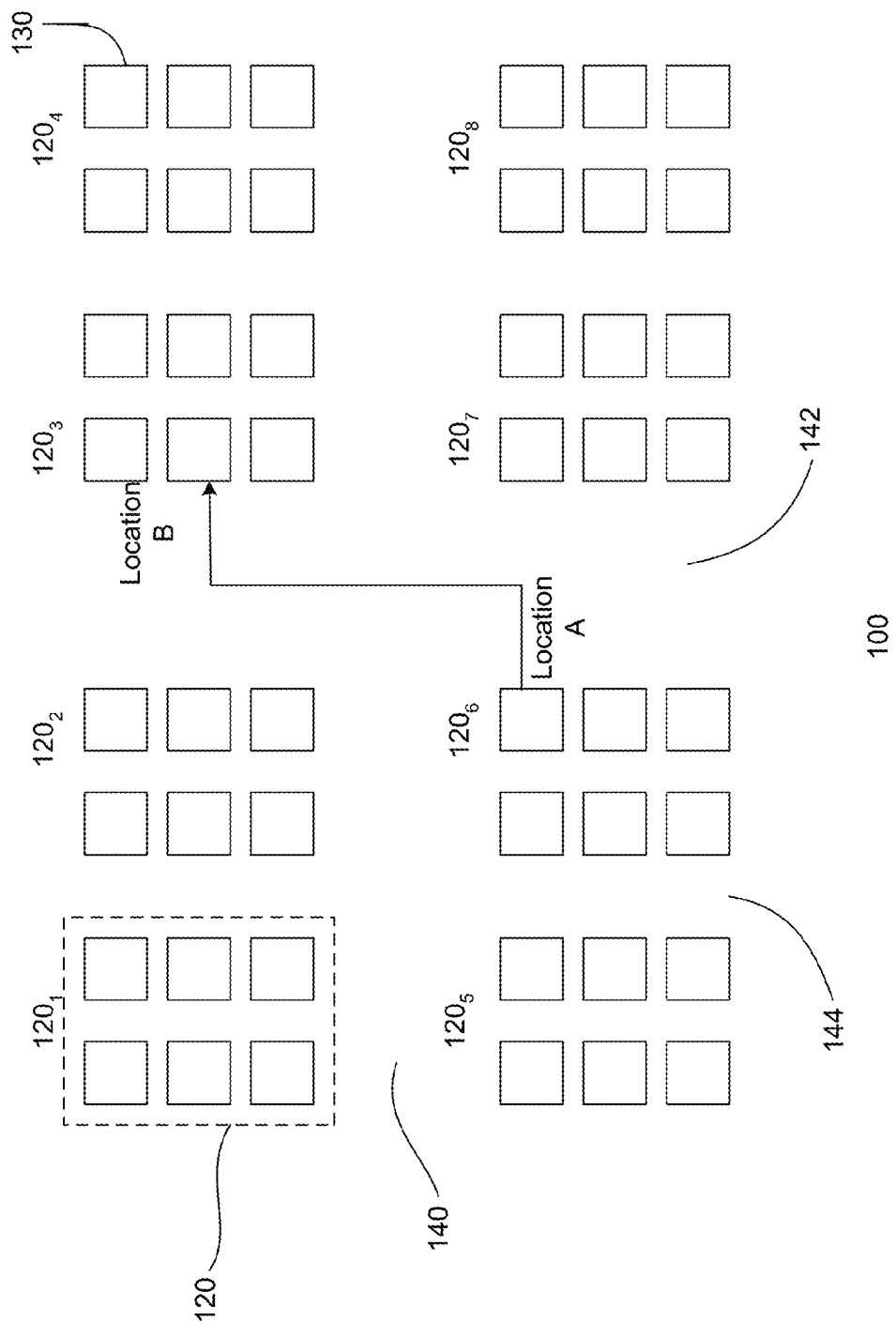

FIG. 1c shows the transport system performing an inter-bay transfer of a carrier between different bays. As shown, the transport system transfers a carrier from Location A in bay $120_6$ to Location B in bay $120_3$. The transfer, for example, is an indirect tool-to-tool transfer. For example, Location A may be a tool while Location B may be a stocker or a WIP rack. Alternatively, Location A may be a stocker or a WIP rack while Location B is a tool. In some cases, both Location A and Location B may be a stocker, rack or a combination thereof. In other embodiments, the transfer may be a direct tool-to-tool transfer.

FIG. 1d shows the transport system performing an inter-fab transfer of a carrier between different fabs. As shown, the transport system transfers a carrier from Location A in bay $120_3$ of fab 110 to Location B in bay $121_2$ of fab 111. The inter-fab transfer maybe an indirect tool-to-tool transfer. Providing an inter-fab direct tool-to-tool transfer may also be useful. For example, Location A and Location B include tools.

Figure 3C:
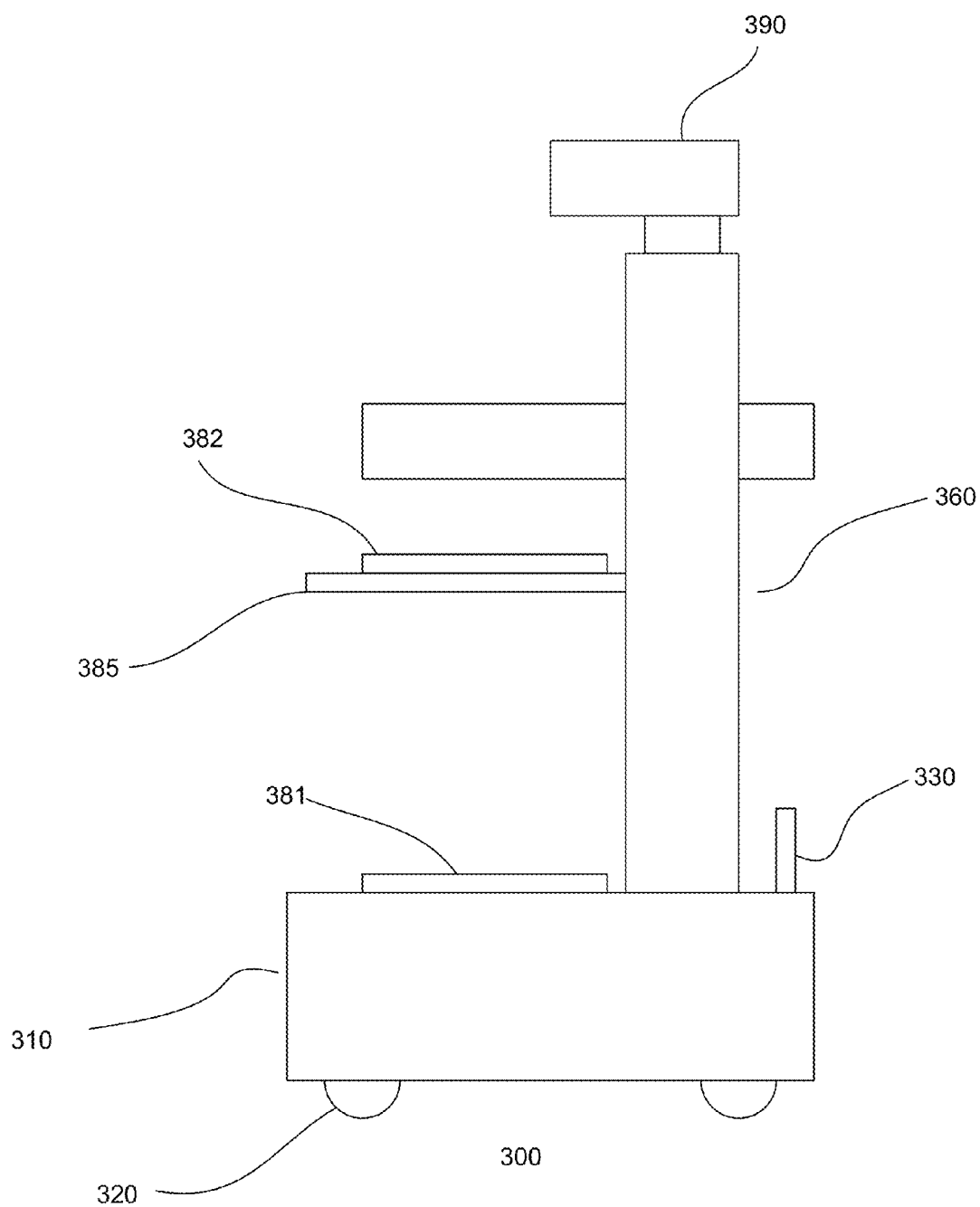
Figure 4A:
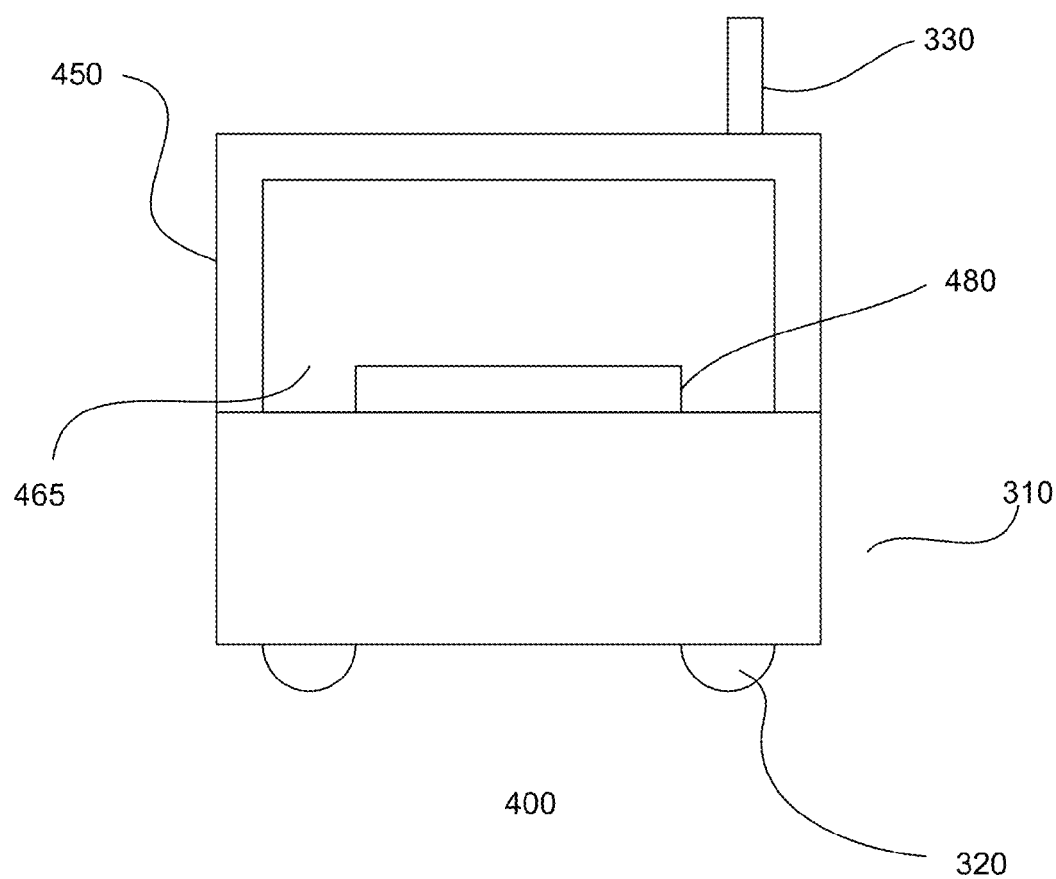
FIGS. 4a-b show various embodiments of a transport unit.
Figure 4B:
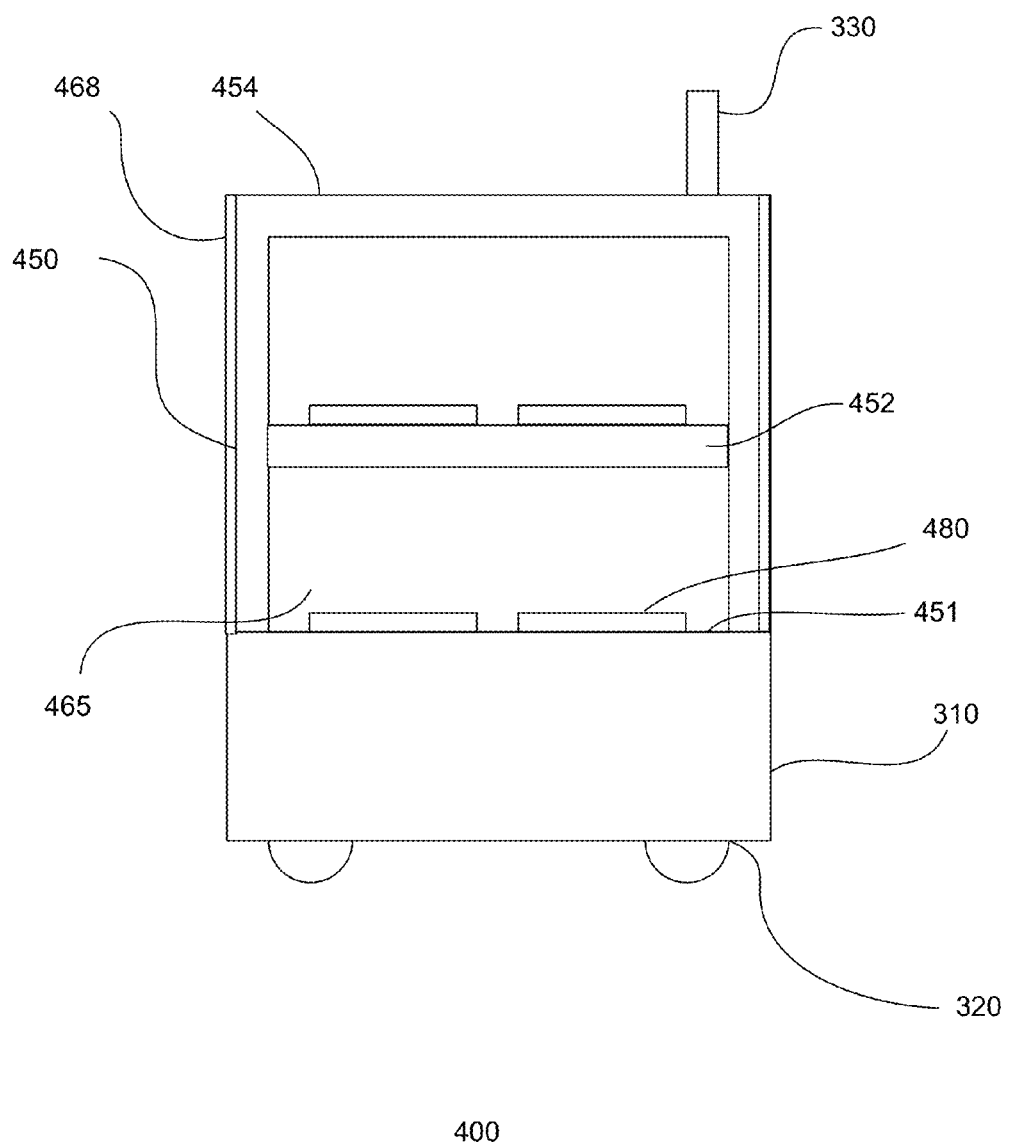

In one embodiment, the transport system includes transport units and U/L units. FIGS. 3a and 3c show simplified views of various embodiments of U/L units 300 and FIGS. 4a-b show simplified views of various embodiments of transport units 400. The transport and U/L units are employed to automatically transfer a carrier from a first location (Location A) to a second location (Location B). In one embodiment, the transport and U/L units are autonomously operated automated guided vehicles (AGVs) which can freely move within the manufacturing facility. Other types of transport and U/L units may also be useful.

Referring to FIGS. 3a, 3c and 4a-4b, the units include a base 310. Wheels 320 are mounted to a bottom of the base. The base includes a drive unit connected to the wheels for propelling the AGV. The drive unit, for example, includes a motor and drive links coupling the motor to the wheels. In one embodiment, the motor is an electric motor powered by a battery (not shown). The drive unit is capable of moving the AGV in any direction, including going straight, making turns as well as rotating the base. In one embodiment, the drive unit is capable of rotating the base 360°. The drive unit should be capable of handling a carrying payload based on operational requirements. For example, in the case of carriers, the drive unit of the base should be capable of carrying the desired amount of carriers. In other embodiments where the AGVs are used to handle devices such as flat panels, the drive unit should be capable of handling the desired amount of flat panels.

The battery may also be used to power other components of the AGV. In one embodiment, the battery can be a replaceable battery. Preferably, the battery can be easily designed for quick and easy replacement. In one embodiment, the battery may be provided as a module, which is configured for quick and easy replacement. For example, the battery module can easily be inserted or extracted from the base, which may contain additional batteries for facilitating automated replacement of a spent battery. The base can also include a charging coupler which facilitates automated charging of the battery. For example, the base can be moved into position at the charging bay for charging via the charging coupler.

The AGVs include a communication system. In one embodiment, the communication system is a wireless communication system, enabling it to communicate with tools, the manufacturing system as well as other AGVs. For example, the wireless communication system may include an antenna 330 for receiving and sending information. The communication system may also include a tag reader. For example, the tag reader is capable of reading the different types of ID tags in the manufacturing facility. For example, the tag reader is capable of reading the different tags of machines as well as the carriers. The reader, for example, may be an infrared reader. In some embodiment, the tag reader may be an RFID reader. Other types of tag readers may also be useful. The type of tag reader, for example, may depend on the type of tags to be read. The tag reader may also be capable of writing information to the tags. In some cases, more than one type of tag reader may be provided.

In one embodiment, the communication system includes communication sensors for communicating with doors, turnstiles, elevators or other possible barriers which may be in the path of travel of the units. The sensors, for example, allow for the AGV to open doors, pass through turnstiles, or to call for an elevator. Other types of communication sensors may also be provided to facilitate autonomous movement in the manufacturing facility. The communication sensors, for example, may be part of a sensor array which includes other types of sensors for other purposes.

The units may include an interface unit for communicating with operators. For example, the interface may include a display and input subunits for displaying information and receiving commands, for example, from operators. The input subunit may be any type of input device, such as a keyboard, buttons or a combination thereof. Other types of interfaces or subunits may also be useful.

A navigation system, in one embodiment, is provided for the AGV. The navigation system may include an object detection module. The object detection module, for example, may include a robotic vision unit and sensors for detecting foreign objects. The robotic vision unit may be a vision scanner or camera while sensors may be proximity and temperature sensors. Other types of robotic vision units, object detection sensors or techniques for detecting foreign objects may also be useful. The detection module may serve as a safety feature of the AGV. For example, the object detection module detects objects, such as people, walls, other AGVs or other objects which may be in the path of travel of the AGV. In one embodiment, the object detection module is capable of delineating between animate and inanimate as well as moving and non-moving objects.

In one embodiment, the AGV is programmed to avoid objects. Inanimate non-moving objects are avoided by moving around or away from them. For moving animate objects, such as another AGV, it communicates with the other AGV and determines a route for avoidance (slide pass). In the case where people are detected, the AGV may activate an alarm to indicate its presence. If people are moving, the AGV may be programmed to stop until movement has stopped or that the people have passed (stop and pass). On the other hand, for non-moving people, the AGV may slide pass. As such, objects detected are avoided by the AGV, enabling autonomous operation safely within a human environment.

The navigation system, in one embodiment, includes a map of the production facility. The map, for example, identifies machines and their locations in the production facility. The map also includes routes in the production facility. Additionally, the map may also include charging and service bays for the AGV. The map, for example, may be provided to the AGV. In one embodiment, the map may be a pre-defined map which is stored in a memory of the AGV. Using the map, the AGV can determine its position within the production area or manufacturing facility. Furthermore, the map facilitates tracking of AGV locations. For example, the AGV can communicate its location within the manufacturing facility to, for example, a production control system.

A variety of mapping technologies can be used and incorporated into the transport system. The mapping of the production facility and the equipment and their locations, for example, can be performed by the AGV using the tag reader and navigation system. Other techniques for mapping the production facility may also be useful. Additionally, the map may be updated as changes are made in the production facility. For example, new equipment, movement of equipment, new paths or routes may be updated to provide the AGV with a real time map.

The AGV may also include a diagnostic module. The diagnostic module performs diagnostics of the various components and systems of the AGV to ensure they are operational. The diagnostic module tracks servicing schedule for the AGV. When a problem is detected or servicing is due, the AGV proceeds to the service bay. Additionally, the diagnostic module monitors the charge level of the battery. When the charge level is below a threshold level, the AGV proceeds to the charging bay to have its battery recharged. The diagnostic module serves to reduce or pre-empts AGV failures.

With respect to a U/L unit, as shown in FIG. 3a, a robot system 360 is disposed on the base. The robot system may include one or more robot arms. For example, the robot system may include two robot arms. The robot arms are configured to handle carriers. For example, the robot arms may be configured to load and unload carriers from machines, including other AGVs such as U/L and transport units. In one embodiment, the robot arms are configured with multiple degrees of freedoms to handle the carriers. Preferably, the robot arms are configured to have at least four degrees of freedom. The robot arms preferably are designed to mimic human arms. For example, the robot arms may be designed to have multiple joints, corresponding to shoulder, elbow and wrist joints. The robot arms may also include clamping or grapping units which may correspond to hands. Other types of robot systems may also be useful.

In some embodiments, the robot system may be configured to handle flat panels, for example, in the manufacturing of flat panel displays. The robot system, for example, is configured to carry flat panels in a vertical orientation (about normal to the production floor). For example, the robot system may include slots for holding the panels in place. A robot arm may load the panels into the slots to securely hold the panels. In other embodiment, a robot arm may be configured to include a slot which can close to engage a panel. For example, the robot arm may be configured to include an F-shaped portion which can engage a panel and be rotated. The arm may then be rotated to position the slot on the bottom of the panel for transport. Other configurations of robot systems for handling panels may also be useful.

In one embodiment, the robot system includes first and second robot arms $370_{1-2}$ configured to pickup and hold a carrier. The robot system may be disposed on a rotatable surface base 340. The rotatable surface base is disposed on the base and can rotate with respect to the base. The robot arms can be translated in first and second directions. The first and second directions, for example, are orthogonal to each other. In one embodiment, the robot arms can translate in a first direction (X-axis) normal to the plane of the production floor, as indicated by arrow 361, and in a second direction (Y-axis) parallel to the plane of the production floor, as indicated by arrow 362. The arms may also be configured to move in a direction (Z-axis) orthogonal to the X and Y axes and parallel to the plane of the production floor, as indicated by arrow 363. Additionally, the robot system can be rotated by the rotatable base. For example, the robot system can rotate around the X-axis ($\theta$ axis), as indicated by arrow 364. This provides the robot system with 4 degrees of freedom along the X-Y-Z-$\theta$ axes. The robot system should be configured to have a range of movement sufficient to load and unload carriers from machines, including tools, stockers, WIPs as well as transport and U/L units.

In other embodiments, the robot system may include a single robot arm. The single robot arm may be configured to handle a carrier and have multiple degrees of freedom. For example, the robot arm is configured to have at least 4 degrees of freedom, for example, along the X-Y-Z-$\theta$ axes.

The robot system includes a robotic vision unit 390. The robotic vision unit, for example, is a vision scanner or a camera. Other types of robotic vision units may also be useful. The robotic vision unit may be the robotic vision unit used for foreign object detection, as previously discussed. The robotic vision unit is configured to distinguish between indexers of tools and objects which are not indexers (foreign objects). This facilitates correct positioning of the carrier with respect to the indexer. In one embodiment, alignment markers may be employed to facilitate accurate positioning of the robot arms. In other embodiments, the robot unit and/or machines may include positioning sensors to facilitate accurate positioning of the robot arms. A robot control unit is used to control the movements of the robot arms. Using the input from the robotic vision unit, the robot control unit can precisely position the robot arms for loading and unloading of a carrier.

FIG. 3b shows a robot arm 370 in greater detail. As shown, the robot arm includes a main support 375. An arm mount 378 is slidably coupled to the main support. The arm mount can slide along the height of the main support, as indicated by arrow 361. This provides movement of the robot arms, for example, along the Y axis. A carrier support 380 is slidably coupled on the arm mount. The carrier support, in one embodiment, can slide along a direction orthogonal to the length of the main support, as indicated by arrow 362. This provides movement of the robot arms, for example, along the X axis. In one embodiment, the main support can be slidably coupled to the base for movement, for example, along the Z axis as indicated by 363. The main support may also be rotatable around the X-axis (θ axis), as indicated by arrow 364. Additionally, the arm mount may be rotatable with respect to the main support, providing an additional degree of freedom of movement for the carrier support.

In another embodiment, as shown in FIG. 3c, the U/L unit may be configured to support the robot system and a storage area for holding one or more carriers. For example, a carrier holder may be provided on the base or rotatable surface base to support a carrier. The carrier holder, for example, is configured to securely hold at least one carrier in place for transport. The carrier holder may include a lock. The lock engages when a carrier is placed in the carrier holder. The lock, for example, prevents unauthorized removal of the carrier from the carrier holder. The lock disengages when the unit arrives at its destination. In some embodiment, an operator may disengage the lock by inputting the appropriate code.

In one embodiment, the U/L unit includes first and second carrier holders 381 and 382 configured to hold two carriers, one above the other. The carrier holders may be mounted on a frame 385. Other configurations of carrier holders may also be useful. In another embodiment, a jig (not shown) may be provided to adapt the carrier holder to hold a white box which is used to contain wafers for shipping and storage. The white box is smaller in dimension than the carrier. The jig provides support for transporting a white box.

As for the transport unit 400, as shown in FIG. 4a, a carrier holder 480 is disposed on the base. The carrier holder, for example, is configured to securely hold at least one carrier in place for transport. The carrier holder may include a lock. The lock engages when a carrier is placed in the carrier holder. The lock, for example, prevents unauthorized removal of the carrier from the carrier holder. The lock disengages when the unit arrives at its destination. In some embodiment, an operator may disengage the lock by inputting the appropriate code. Additional carrier holders may be provided to hold additional carriers. For example, a second carrier holder may be disposed on the base to hold a second carrier. In other embodiments, a carrier frame may be provided to support a second carrier holder above the first carrier holder. Providing other arrangements for holding the carriers may also be useful.

In another embodiment, a jig (not shown) may be provided to adapt the carrier holder to hold a white box which is used to contain wafers for shipping and storage. The white box is smaller in dimension than the carrier. The jig provides support for transporting a white box.

In some embodiment, a frame 450 may be disposed on the base surrounding the carrier holder(s) to form a carrier compartment 465. In the case where a carrier frame exists, the carrier holder and frame may be integrated. The compartment may be an open compartment defined by the frame. In other embodiments, the compartment may be an enclosed compartment. The enclosed compartment may include a compartment door which is opened for loading and unloading and closed for transporting. Transport units with an enclosed compartment, for example, maybe employed for inter-fab transfers. In some embodiments, the compartment may be a partially enclosed compartment. Other configurations of compartments may also be useful.

As shown in FIG. 4b, the transport unit 400 includes four carrier holders 480. For example, a frame 450 is disposed on the base. Two carrier holders are disposed on a bottom shelf 451 while two others are disposed on an upper shelf 452 of the frame. This arrangement enables the transport to securely hold four carriers, for example, two on the upper shelf above two on the bottom shelf. A top 454 of the frame is disposed above the upper shelve, forming a carrier compartment 465. Covers 468 are provided. For example, covers may be provided on all sides to provide an enclosed carrier compartment. In some cases, the compartment may be a partially enclosed compartment. For example, covers may be provided on two opposing ends of the carrier compartment. Other configurations of partially covered compartments may also be useful. In yet other embodiments, no covers may be provided to provide an open carrier compartment.

In other embodiments, the transport unit may be configured to transport panels. For example, the transport unit may include panel holders which hold panels securely in place for transport. Configuring the transport units for other types of devices may also be useful.

The U/L and transport units are employed to facilitate automated transfers of carriers within the manufacturing facility. In one embodiment, the U/L units are intended to be employed for localized movement of carriers. For example, localized movement includes intra-bay transfers, transfers within a section of a production area or transfers within a limited distance. For example, the upper distance threshold of travel for the U/L units may be limited to about 240 meters. Other upper distance thresholds may also be useful. The threshold distance may depend on operational requirements, such as speed of the U/L units and U/L transport time limits. The transport units, on the other hand, are intended for movement involving longer distances in the manufacturing facility. For example, the transports are intended for inter-bay and inter-fab transports as well as transports of distances greater than the upper distance threshold for U/L units. The use of different types of units provides flexibility in movement of carriers in the manufacturing facility. Depending on need, U/L units may be employed under certain situations for movements involving longer distances. Other configurations of movements of carriers by the transport and U/L units may also be useful. In some cases, the transport unit may be employed to push or tow racks.

The number of U/L and transport units in the transport system may be selected appropriately based on the layout of the production area or areas. In one embodiment, the number of units may be optimized to minimize non-transport time of the U/L and transport units. For example, the units idle and charge time are minimized. This ensures maximum utilization of the transport and U/L units. It is understood that the number of U/L units need not equal the number of transport units. The optimization may be determined by simulations using parameters based on, for example, operational requirements.

Some exemplary operational requirements of the U/L and transport units are provided in Table 1.

TABLE 1

| Common U/L Unit and Transport Unit Operational Requirements | |
|---|---|
| Speed | Min ≈1-1.2 meter/second |
| Battery operational/charge ratio | Min ≈5:1 |
| Battery Life | Min ≈1 year |
| Changeable battery | |
| Safety | Alarm or warning indicator |
| | Object detection and avoidance |
| Command interface | Display sub-unit |
| | Input sub-unit |
| Clean room compatible | Class 100 |
| Indexer Detection | Indexer identification and alignment |
| Navigation | Mapping of manufacturing facility |
| Communications | Production control system |
| | U/L and Transport Units |
| | Tag reader |
| Non-common Transport Unit Operational Requirements | |
| Carrying Payload | Min ≈25 Kilograms |
| Non-common U/L Unit Operational Requirements | |
| Carrying Payload | Min ≈12 Kilograms |
| Robot System | Min Payload ≈12 Kilograms |
| | Min four degrees of freedom of movement |
| | Min height movement ≈0.7-1.2 meter |
| | Min positional accuracy ≈0.1 millimeter |
| | Load/Unload cycle ≈30 seconds |

By providing a transport system which includes U/L and transport units which are AGVs improves transport performance. For example, transfer times may be reduced compared to, for example, OHT systems. Furthermore, the AGVs increase transfer flexibility. For example, different types of transfer may be effected using any combination of U/L and transport units. Such flexibility can lead to improved efficiency as well as reduced transfer time. Moreover, the use of U/L and transport units reduces the need for human interaction in the production area, thereby reducing human error and labor costs. As such, higher throughput, yields and efficiency can be achieved, all leading to lowered production costs and increased revenues.

FIGS. 5a-e show various types of transfers 500a-e in a production area utilizing an embodiment of the transport system. The transfers are between a first location (Location A) to a second location (Location B). The locations include machines, which may include any combination of tools, stockers and WIP racks. Additionally, the locations may, in some instances, include units, such as UL and transport units. For example, in the case of a direct transfer between tools, Location A and Location B include tools. For the case of an indirect transfer between tools, one location includes a tool while the other includes a machine which is not a tool. For example, the non-tool machine maybe a stocker or a WIP rack. In some cases, an indirect transfer may involve non-tool machines at both locations, such as any combination of stockers and/or racks.

Figure 5A:
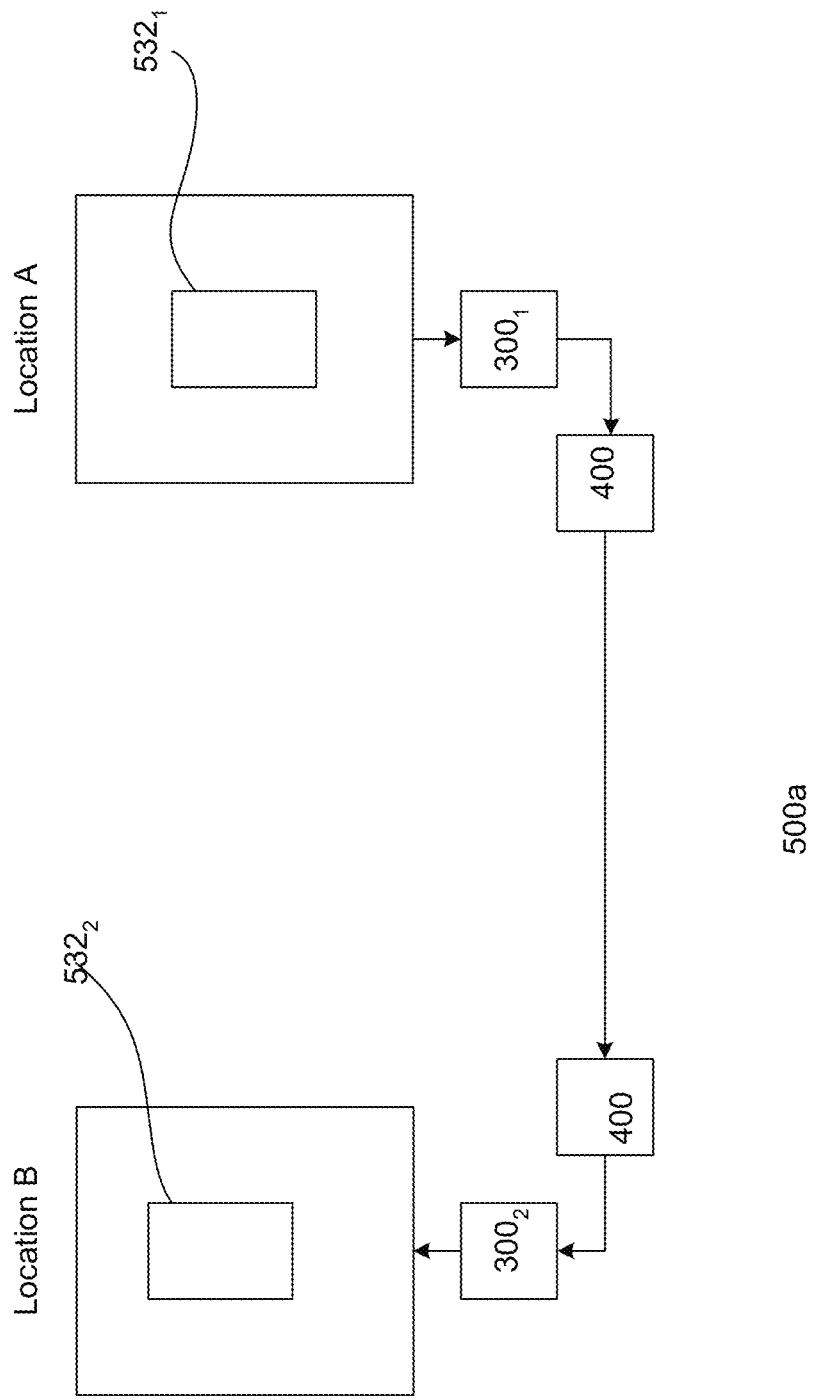

As shown in FIG. 5a, a first U/L unit $300_1$ unloads a carrier from a port $532_1$ at Location A. As discussed, Location A may be a tool, stocker or rack. The U/L unit may read the carrier ID to make sure that it is the correct carrier to be unloaded from Location A. The carrier is loaded onto a transport unit 400. The transport unit proceeds to transport the carrier to location B. Depending on the transfer, Location B may be a tool or a non-tool machine, such as a stocker or a WIP rack. A second U/L unit $300_2$ unloads the carrier from the transport unit and loads it into port $532_2$ at Location B. The port, for example, may be a port of a tool, a port of a stocker or a position of a WIP rack, such as on a smart tray. The U/L unit may check the carrier ID to ensure that it is the correct carrier to unload from the transport unit and load into the port. As described, the transfer involves a first U/L unit passing a carrier to a transport unit and a second U/L unit retrieving the carrier from the transport unit.

In one embodiment, the U/L and transport units are capable of communicating with each other. For example, the U/L may receive an indication from the transport unit that it has arrived at the destination and is ready for unloading or loading by the U/L unit. When the U/L unit completes its task, it may inform the transport unit so that it can depart. The U/L and transport units may also communicate with the production control system, informing it of their status.

Figure 5B:
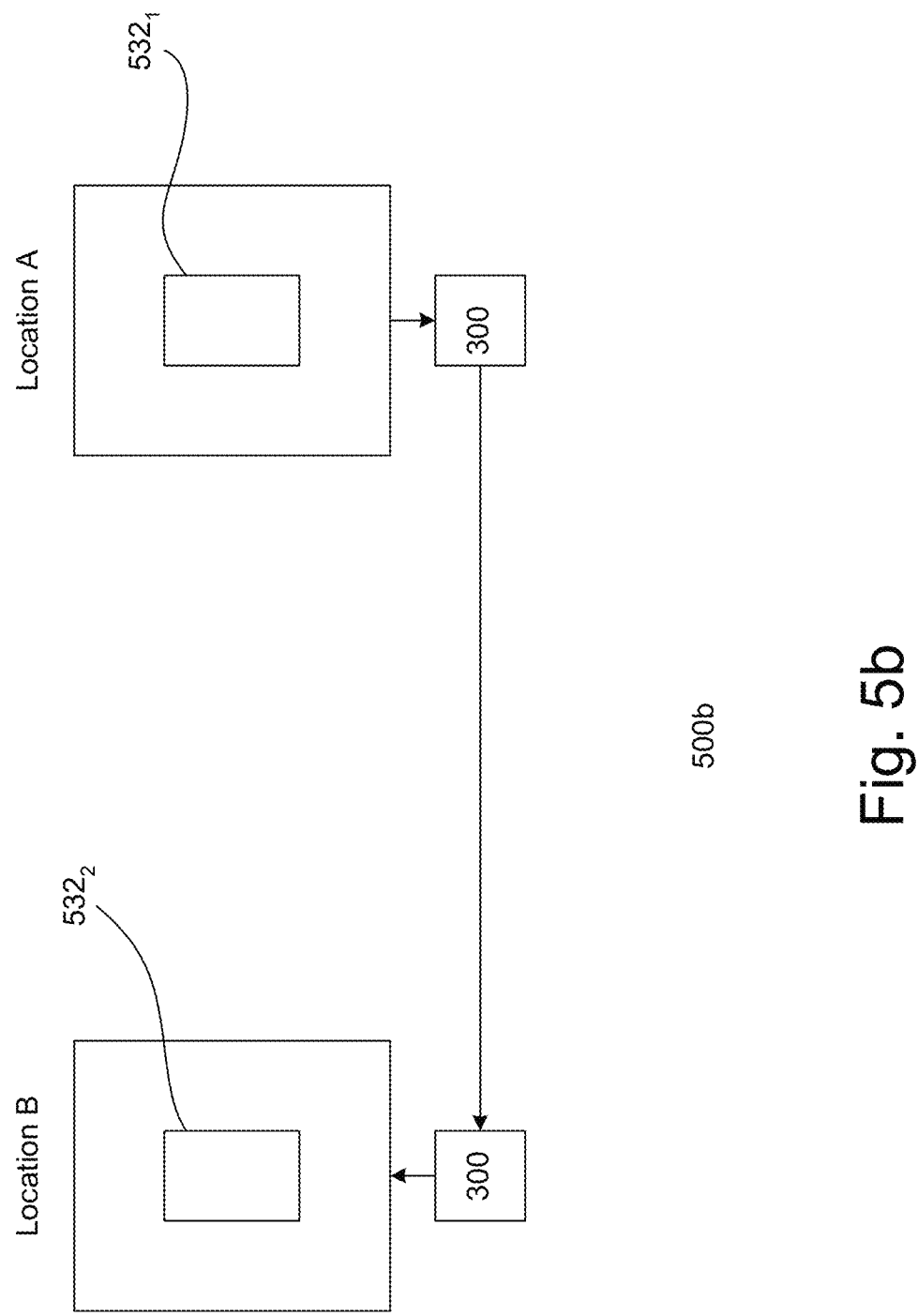

In FIG. 5b, a U/L unit 300 unloads a carrier from a port $532_1$ at Location A. The U/L may read the carrier ID to make sure that it is the correct carrier to be unloaded from Location A. The U/L unit proceeds to Location B with the carrier where it unloads the carrier to port $532_2$. The U/L unit may be used to transfer a carrier from Location A to Location B. This provides added flexibility in the transfer of carriers from one location to another.

Figure 5C:
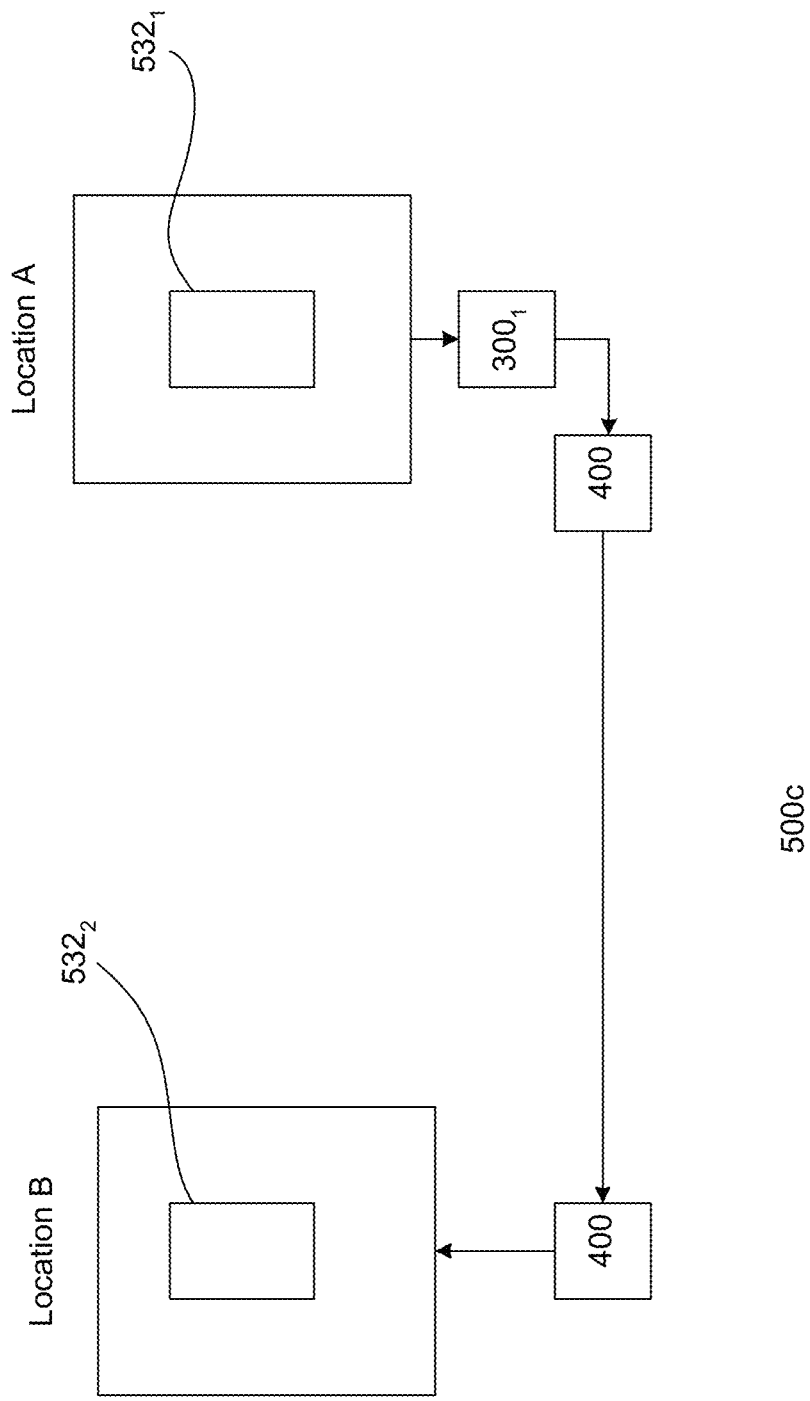

FIG. 5c shows another type of transfer from Location A to Location B. Similar to FIG. 5a, a first U/L unit $300_1$ unloads a carrier from a port $532_1$ at Location A. The U/L unit may read the carrier ID to make sure that it is the correct carrier to be unloaded from Location A. The carrier is loaded onto a transport unit 400. The transport unit proceeds to transport the carrier to location B. Unlike FIG. 5a, an operator unloads the carrier from the transport unit and loads it into port $532_2$ at Location B. The use of an operator provides added flexibility in the transfer of carriers form Location A to Location B.

FIG. 5d shows another type of transfer from Location A to Location B. The transfer is similar to that shown in FIG. 5c except that an operator is employed to load the carrier from port $532_1$ onto a transport unit 400 at Location A and a second U/L unit $300_2$ is used to unload the carrier from the transport unit and load it into port $532_2$. In another embodiment, operators may be used to load and unload the carriers at Location A and Location B, as shown in FIG. 5e.

In addition, other types of transfers may be employed. In some cases, a transfer may involve a transfer between two U/L units. This type of transfer may be particularly useful for U/L units which can hold two carriers. For example, a first U/L unit may be dispatched to a second U/L unit to take over possession of the carrier from the first U/L unit. In other embodiments, a U/L unit may be dispatched to a transport unit and take over possession of a carrier from the transport unit.

As discussed, the production area may include sub-areas on different planes or levels. A rack may be employed to facilitate transfer of carriers from one level to another. In one embodiment, a rack may be disposed on the upper level at about the step. To transfer from one level to another, a first U/L on one level unit loads the rack which is then picked up by a second U/L unit on another level. The first U/L unit may be on the lower level and the second U/L unit may be on the upper level to effect a transfer from the lower level to the upper level. Alternatively, the first U/L unit may be on the upper level and the second U/L unit may be on the lower level to effect a transfer from the upper level to the lower level.

Figure 6:
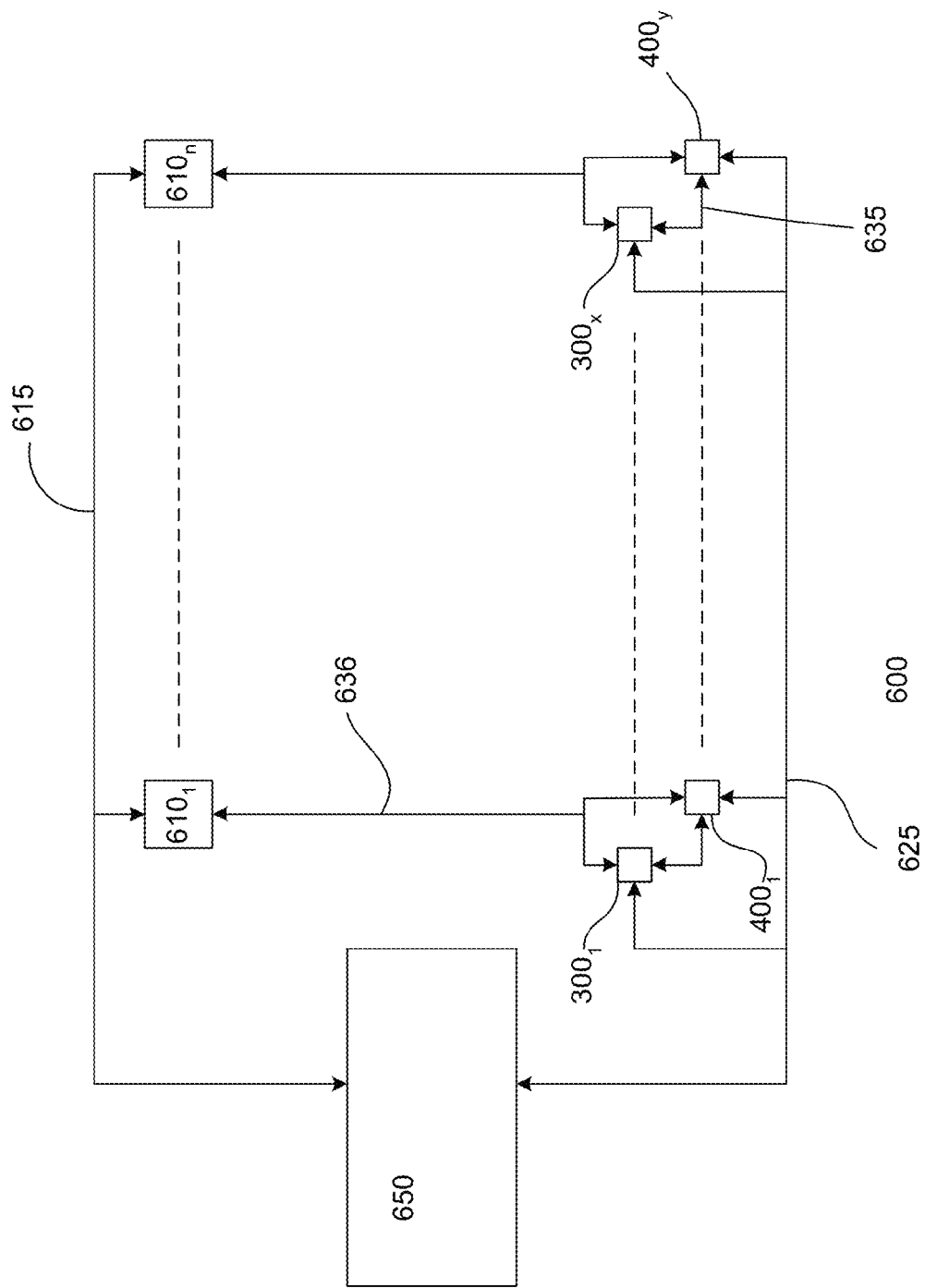
FIG. 6 shows an embodiment of a computer controlled production area.

FIG. 6 shows a simplified diagram of an embodiment of a computer controlled production area 600. As shown, the production area includes a production control system 650 which controls the manufacturing process for forming semiconductor devices. Producing other types of devices may also be useful. Devices, for example, are formed on wafers or substrates. A group of wafers (lot) is processed together. The wafers of a lot are contained in a carrier, such as a pod, to facilitate handling and movement through the manufacturing process. Each wafer is associated with a wafer ID and each carrier is associated with a lot ID. The wafers in a lot are assigned to a carrier. The production control system can enable the manufacturing process to be fully automated or partly automated as required.

The production control system, for example, includes one or more computer systems executing computer programs which cooperates together to control the manufacturing process. The production control system, for example, tracks and controls the flow of wafers from the start to the end of the process. The status of each wafer, such as lot information, stage of processing and location is maintained by the production control system.

The production control system controls the flow of carriers to different machines $610_{1-n}$ in the production area. Machines may include, for example, tools, stockers and WIP racks. Machines may also include other components of the manufacturing facility which includes an ID. The machines may be grouped in bays. The bays may be disposed in one or more fabs. Other arrangements of machines may also be useful. A tool may include a machine control program, such as a machine supervisory program (MSP), to control the operation of the tool. The production control system, in one embodiment, communicates with the tools. For example, the production control system communicates with the MSPs of the tools. The communication between the tools and production control system may be bi-directional, as indicated by arrow 615. The tools may also be in communication with each other. By communicating with the tools, the production control system identifies which tools are ready (tool readiness), which is used to determine the flow of carriers.

The production control system also controls a transport system having a plurality of U/L units $300_{1-x}$ and transport units $400_{1-y}$. It is understood that n and x need not be equal. The U/L and transport units facilitate automated transfer of carriers in the production area. A U/L unit includes a robot system for handling and transporting carriers while a transport unit transports carriers. Each unit is provided with a tag which stores the unit ID. The tag may also include information relating to the lot which the unit is handling or transporting, such as but not limited to next recipes, stage of production, and wafer quantity.

The production control system communicates with the units to facilitate the transfer of carriers. The communication, for example, is a two-way communication, indicated by arrow 625. To facilitate communication with the production control system, communication interfaces may be provided for the AGV units. The production control system may instruct the appropriate AGV units to initiate a transfer. For example, when a machine (e.g., at Location A) completes or is about to complete processing of lot of wafers, MSP informs the production control system. The production control system determines the next destination (e.g., at Location B) of the lot. The production control system instructs the transport system to effect the transfer of the lot from Location A to Location B. This may involve just the U/L unit or both U/L and transport units.

In one embodiment, the communication between the various components of the manufacturing facility is a smart communication system. For example, each U/L and transport units may be in direct or indirect communication with each machine as well as with each other, as indicated by arrows 635 and 636. Indirect communication may be facilitated by, for example the production control system. The communication system, in one embodiment, is a wireless communication system which includes Wi-Fi transponders. For example, the tools, U/L units and transport units are provided with Wi-Fi transponders. In other embodiments, the communication system may be a hybrid communication which includes both wireless and wired communication links.

Figure 7:
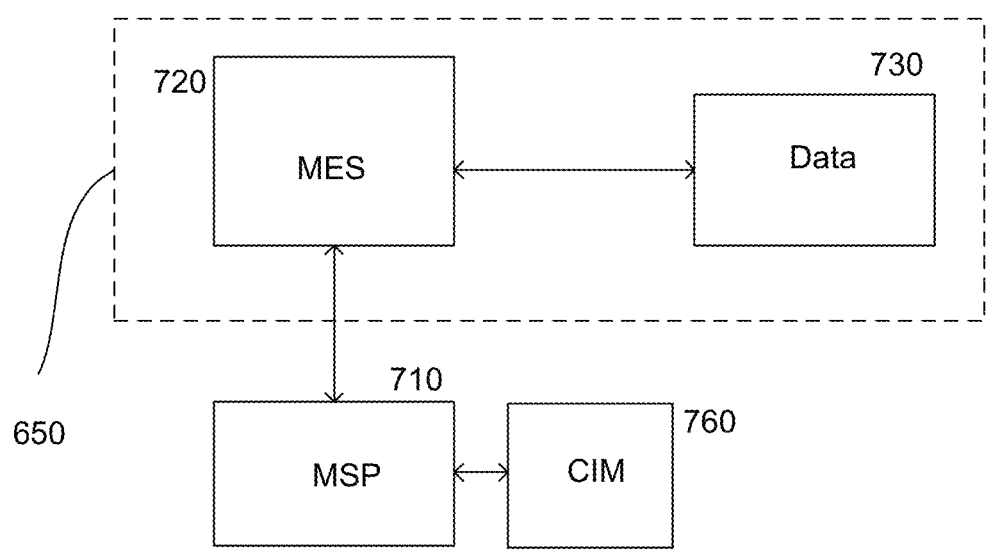
FIG. 7 shows an embodiment of a control system.

FIG. 7 shows an embodiment of a production control system 650. The production control system, in one embodiment, includes a manufacturing execution system (MES) 720. The MES communicates with a data unit 730. The data unit contains all data related to the manufacturing process, such as wafer IDs, recipes, tools, locations of tools, as well as other information related to the manufacturing process. In addition, the data includes tool indexers and chamber IDs of tools. This locks indexers to their respective tools. The MES tracks the overall execution or operations in the production area. The MES may also perform functions associated with the production facility, such as tracking the location of carriers, tracking status of equipments or tool readiness, performing lot reservations and putting lots on hold. For example, the MES communicates with the MSPs 710 of the tools to determine tool readiness.

The MES contains an inventory list of the lots in the production area and information concerning the lots such as lot priority and dispatching lot sequence. The MES also includes a lot list of work in progress for a tool, including perhaps priority ranking of the lots. Based on the lot list, the MES determines the next destination for lots which have been processed by a tool and ready to be removed therefrom. The next destination may depend on the priority status of a lot as well as availability of tools to perform the next process for the lot.

The MES issues instructions to the U/L and transport units to initiate transfer of carriers based on the identified next destinations. In one embodiment, the units may be provided with interface which enables seamless communication with the MES and other applications. In one embodiment, definitive instructions to the units are issued to initiate a transfer. For example, a definitive instruction includes an instruction for transferring a specific lot to a specific tool at about a specific time (e.g., +/−buffer).

A CIM interface 760 maybe provided to enable an operator to communicate with the MSP. In some embodiments, the CIM communicates indirectly with the MSP via the indexer of the tool. The CIM also facilitates indirect communication with the MES through the MSP. For example, an operator may request dispatching of units by the MES through the CIM.

In some embodiments, the functions of the MES may be distributed to additional sub-systems of the manufacturing control system. For example, the production control system may include a material control system (MCS) for dispatching units and real time dispatcher (RTD) for providing the lot list. Additional sub-systems may also be included in the production control system.

The preferred embodiment of the invention is illustrative of the invention rather than limiting of the invention. It is to be understood that revisions and modifications may be made to methods and systems described herein while still providing a manufacturing automation system and an automated method for movement of material that fall within the scope of the included claims. All matters hitherto set forth herein or shown in the accompanying figures are to be interpreted in an illustrative and non limiting sense.

What is claimed is:

1. A method for automated handling for forming a device comprising:
   providing a production area with a plurality of destinations and a transport system comprising distinct transport units and load/unload (U/L) units which can freely and autonomously move in the production area to transfer carriers from one location to another location, the distinct transport units and U/L units comprise autonomously operated automated guided vehicles (AGVs), wherein
      an AGV includes a navigation system with an object detection module for autonomous operation in the production area,
      an AGV transport unit includes a storage compartment for holding at least one carrier containing production material for forming the device, wherein the AGV transport unit is dedicated to transport carriers from one location to another location, and
      an AGV U/L unit comprises a robotic system for automatically handling carriers and transporting carriers from one location to another location, wherein handling the carriers comprise loading a carrier into a machine from the AGV transport unit, and unloading a carrier from a machine onto the AGV transport unit, and
         the AGV U/L unit transports a carrier from one location to another location if the locations are less than a threshold distance;
   determining a transfer of a selected carrier from a first destination to a second destination using one or more of the distinct AGV transport units and U/L units based at least in part on the identified first and second destinations and the threshold distance; and
   issuing a request to the transport system to effect the transfer of the selected carrier, wherein effecting the transfer comprises
      employing a first selected U/L unit at the first destination for automatically loading the selected carrier onto a first selected transport unit,
      employing the first selected transport unit to transfer the selected carrier to the second destination, and
      employing a second selected U/L unit to unload the selected carrier from the first selected transport unit, or
      employing the first selected U/L unit at the first destination for handling the selected carrier and transporting the selected carrier to the second destination,
      wherein the transfer of the selected carrier is performed based on a lot list ranked by priority provided by a real-time dispatcher module of a production control system and based on an updated map of the production area.

2. The method of claim 1 wherein the carrier is a wafer carrier capable of containing a plurality of wafers used in forming semiconductor devices, the plurality of wafers form a lot of wafers.

3. The method of claim 1 wherein the device comprises a flat panel display device.

4. The method of claim 1 wherein the first and second destinations comprise machines which include tools, stockers, racks or a combination thereof.

5. The method of claim 4 wherein the tools are associated with indexers for reading information on a carrier tag of the selected carrier.

6. The method of claim 4 wherein:
   a tool comprises a machine supervisory program (MSP) for controlling the operation of the tool; and further comprises
   a production control system for tracking and controlling the flow of carriers in the production area; and
   a smart communication system between the MSPs of the tools, the production control system, the AGV U/L units and AGV transport units of the transport system.

7. The method of claim 6 wherein the communication system provides direct or indirect communication between the MSPs of the tools, the production control system, the AGV U/L units and AGV transport units of the transport system.

8. The method of claim 1 wherein the AGVs contain a map of the production area, wherein the map includes routes and locations of destinations.

9. The method of claim 1 wherein effecting the transfer comprises:
   unloading the selected carrier at the first destination by the first selected U/L unit; and
   loading the selected carrier at the second destination by the first selected U/L unit.

10. The method of claim 1 wherein effecting the transfer comprises:
    unloading the selected carrier at the first destination by the first selected U/L unit; and
    loading the selected carrier at the second destination by the second selected U/L unit.

11. The method of claim 10 further comprises:
    loading the selected carrier onto the selected transport unit at the first destination;
    transferring the selected carrier to the second destination by the selected transport unit; and
    unloading the selected carrier from the selected transport unit by the second selected U/L unit.

12. The method of claim 1 wherein the AGVs comprise the object detection module for detecting and avoiding objects for safe operation in a human environment.

13. A method for automated handling for forming a device comprising:
    providing a production facility with a plurality of destinations;
    providing distinct transport units and load/unload (U/L) units which can freely and autonomously move in the production facility to transfer carriers from one location to another location, the distinct transport units and U/L units comprise autonomously operated automated guided vehicles (AGVs), wherein
       an AGV includes a navigation system with an object detection module for autonomous operation in a production area,
       an AGV transport unit is dedicated to transport one or more carriers in a storage compartment of the AGV transport unit, a carrier contains production material for forming the device,
       an AGV U/L unit includes a robotic system for automatically handling carriers and transporting carriers from one location to another location, wherein handling the carriers comprise loading a carrier into a machine from the AGV transport unit, and unloading a carrier from a machine onto the AGV transport unit, and
the AGV U/L unit transports a carrier from one location to another location if the locations are less than a threshold distance; and
transporting a selected carrier containing material for forming the device from a first machine at a first location to a second machine at a second location, wherein the transporting of the selected carrier comprises
employing a first AGV U/L unit to unload the selected carrier from the first machine and loading the selected carrier onto a first AGV transport unit, the first AGV transport unit moving from the first location to the second location to transport the selected carrier to the second location, and
employing a second AGV U/L unit to unload the selected carrier from the first AGV transport unit and loading the selected carrier in the second machine;
wherein the transporting of the selected carrier is performed based on a lot list ranked by priority provided by a real-time dispatcher module of a production control system and based on an updated map of the production area.

14. An automated handling system for forming a device comprising:
a production facility having a plurality of locations with machines;
a carrier containing material forming the device; and
distinct load/unload (U/L) units and transport units which can freely and autonomously move for effecting transfer of the carrier from a first location to a second location in the facility, the distinct U/L units and transport units comprise autonomously operated automated guided vehicles (AGVs), wherein
an AGV includes a navigation system with an object detection module for autonomous operation in a production area,
an AGV transport unit includes a storage compartment for holding at least one carrier containing production material for forming the device, wherein the AGV transport unit is dedicated to transporting at least one carrier,
an AGV U/L unit comprises a robotic system for automatically handling carriers and transporting carriers from one location to another location, wherein handling the carriers comprise loading a carrier into a machine from the AGV transport unit, and unloading a carrier from a machine onto the AGV transport unit, and
the AGV U/L unit transports a carrier from one location to another location if the locations are less than a threshold distance, and
a transfer from the first location to the second location comprises
employing a first AGV U/L unit at the first location, wherein the first AGV U/L unit unloads a selected carrier from a first machine at the first location and loads the selected carrier onto a first AGV transport unit which proceeds to the second location, and
employing a second AGV U/L unit at the second location, wherein the second AGV U/L unit unloads the selected carrier from the first AGV transport unit and loads the selected carrier into a second machine at the second location;
wherein the transporting of the selected carrier from one location to another location is performed based on a lot list ranked by priority provided by a real-time dispatcher module of a production control system and based on an updated map of the production area.

15. An automated handling system for forming a device comprising:
automated guided vehicle (AGV) transport units;
AGV load/unload (U/L) units;
the distinct AGV transport units and AGV U/L units can freely and autonomously move to transfer carriers from one location to another location, and comprise autonomously operated AGVs, wherein
an AGV includes a navigation system with an object detection module for autonomous operation in a production area,
an AGV transport unit includes a storage compartment for holding at least one carrier containing production material for forming the device, wherein the AGV transport unit is dedicated to transporting at least one carrier, and
an AGV U/L unit comprises a robotic system for automatically handling carriers and transporting carriers from one location to another location, wherein handling carriers comprise loading a carrier into a machine from the AGV transport unit, and unloading a carrier from a machine onto the AGV transport unit, and
the AGV U/L unit transports a carrier from one location to another location if the location are less than a threshold distance; and
a production control system for issuing commands to the distinct AGV transport units and AGV U/L units, thereby controlling the flow of production for forming the device;
wherein the transporting of the carriers from one location to another location is performed based on a lot list ranked by priority provided by a real-time dispatcher module of a production control system and based on an updated map of the production area.

16. The system of claim 15 wherein the distinct AGV transport units and AGV U/L units contain a map of the production area, wherein the map includes routes and locations of destinations.

17. The system of claim 15 wherein the object detection module of the distinct AGV transport units and AGV U/L units detects and avoids objects for safe operation in a human environment.

18. The system of claim 15 wherein the robotic system of the AGV U/L units comprises at least one robotic arm for loading and unloading a carrier.

19. The system of claim 15 wherein the robotic system of the AGV U/L units comprises a robotic vision unit for precise positioning of a carrier for loading and unloading.

* * * * *